US00RE47542E

(19) United States
(12) Reissued Patent
Fujimoto et al.

(10) Patent Number: US RE47,542 E
(45) Date of Reissued Patent: Jul. 30, 2019

(54) MEMORY SYSTEM IN WHICH EXTENDED FUNCTION CAN EASILY BE SET

(71) Applicant: TOSHIBA MEMORY CORPORATION, Minato-ku (JP)

(72) Inventors: Akihisa Fujimoto, Yamato (JP); Hiroyuki Sakamoto, Ome (JP)

(73) Assignee: TOSHIBA MEMORY CORPORATION, Minato-ku (JP)

(21) Appl. No.: 15/463,765

(22) Filed: Mar. 20, 2017

Related U.S. Patent Documents

Reissue of:
(64) Patent No.: 9,335,953
Issued: May 10, 2016
Appl. No.: 14/797,867
Filed: Jul. 13, 2015

U.S. Applications:
(63) Continuation of application No. 13/956,825, filed on Aug. 1, 2013, now Pat. No. 9,104,539, which is a
(Continued)

(30) Foreign Application Priority Data

Feb. 4, 2011 (JP) ..... 2011-023217
May 17, 2011 (JP) ..... 2011-110242

(51) Int. Cl.
*G06F 13/00* (2006.01)
*G06F 13/28* (2006.01)
(Continued)

(52) U.S. Cl.
CPC ..... *G06F 3/0659* (2013.01); *G06F 3/0604* (2013.01); *G06F 3/0679* (2013.01);
(Continued)

(58) Field of Classification Search
CPC ..... G06F 13/1689; G06F 13/385; G06F 13/4239; G06F 12/0653; G06F 3/0607;
(Continued)

(56) References Cited

U.S. PATENT DOCUMENTS 5,280,599 A 1/1994 Arai
5,999,441 A 12/1999 Runaldue et al.
(Continued)

FOREIGN PATENT DOCUMENTS

CN 101689246 A 3/2010
JP 2001-356885 12/2001
(Continued)

OTHER PUBLICATIONS

Leonard Ott, "Designing for SDIO," Jul. 15, 2004, https://www.wirelessdesignmag.com/product-release/2004/07/designing-sdio.*
(Continued)

*Primary Examiner* — Christopher E. Lee
(74) *Attorney, Agent, or Firm* — Oblon, McClelland, Maier & Neustadt, L.L.P.

(57) ABSTRACT

According to one embodiment, a memory system, such as a SDIO card, includes a nonvolatile semiconductor memory device, a control section, a memory, an extended function section, and an extension register. The extended function section is controlled by the control section. A first command reads data from the extension register in units of given data lengths. A second command writes data to the extension register in units of given data lengths. A extension register includes a first area, and second area different from the first area, information configured to specify a type of the extended function and controllable driver, and address information indicating a place to which the extended function is assigned, the place being on the extension register, are recorded in the first area, and the second area includes the extended function.

25 Claims, 32 Drawing Sheets

Related U.S. Application Data continuation of application No. PCT/JP2011/071776, filed on Sep. 16, 2011.

(51) Int. Cl.

| | |
|---|---|
| ***G06F 12/00*** | (2006.01) |
| ***G06F 12/02*** | (2006.01) |
| ***G06F 3/06*** | (2006.01) |
| ***G06F 9/30*** | (2018.01) |
| ***G11C 5/00*** | (2006.01) |

(52) U.S. Cl.

CPC ..... *G06F 9/30134* (2013.01); *G06F 12/00* (2013.01); *G06F 12/0238* (2013.01); *G11C 5/00* (2013.01)

(58) Field of Classification Search

CPC ..... G06F 9/321; G06F 21/77; G06K 7/0008; G06K 18/072; G06K 18/0723

USPC ..... 710/10, 11, 13, 65, 104, 301; 711/103, 711/154; 235/380, 492; 370/463

See application file for complete search history.

(56) References Cited

U.S. PATENT DOCUMENTS

| | | | | |
|---|---|---|---|---|
| 6,886,083 | B2 * | 4/2005 | Murakami | G06F 21/77 235/380 |
| 7,024,225 | B2 * | 4/2006 | Ito | G06K 7/0008 370/463 |
| 7,296,097 | B2 * | 11/2007 | Kanamori | G06F 13/4239 710/10 |
| 7,484,020 | B2 | 1/2009 | Takinosawa et al. | |
| 7,669,773 | B2 * | 3/2010 | Nishizawa | G06K 19/072 235/380 |
| 8,015,340 | B2 * | 9/2011 | Cedar | G06F 12/0653 710/104 |
| 8,370,535 | B2 * | 2/2013 | Hahn | G06F 3/0607 710/11 |
| 8,495,268 | B2 * | 7/2013 | Hirano | G06F 13/385 710/13 |
| 2002/0004864 | A1 | 1/2002 | Kubota | |
| 2002/0065044 | A1 | 5/2002 | Ito et al. | |
| 2004/0205268 | A1 | 10/2004 | Takinosawa et al. | |
| 2005/0224589 | A1 * | 10/2005 | Park | G06K 19/0723 235/492 |
| 2006/0218324 | A1 * | 9/2006 | Zayas | G06F 13/385 710/65 |
| 2007/0011394 | A1 * | 1/2007 | Hsu | G06F 9/321 711/103 |
| 2007/0094504 | A1 * | 4/2007 | Takinosawa et al. | 713/172 |
| 2009/0164815 | A1 | 6/2009 | Ohyama | |
| 2010/0268897 | A1 * | 10/2010 | Okamoto | G06F 13/1689 711/154 |
| 2010/0281200 | A1 * | 11/2010 | Okamoto | G06F 13/385 710/301 |
| 2012/0210046 | A1 * | 8/2012 | Ito et al. | 711/103 |

FOREIGN PATENT DOCUMENTS

| | | | |
|---|---|---|---|
| JP | 2002-171303 | A | 6/2002 |
| JP | 2003-115890 | A | 4/2003 |
| JP | 2004-046498 | | 2/2004 |
| JP | 2006-018610 | | 1/2006 |
| JP | 2006-236200 | | 9/2006 |
| JP | 2008-269380 | | 11/2008 |
| JP | 2009-157493 | A | 7/2009 |
| WO | WO20041077306 | A1 | 9/2004 |

OTHER PUBLICATIONS

Toshiba, "Toshiba SD Card Specification," Dec. 29, 2006.*

Office Action dated Jan. 28, 2015 in Chines Patent Application No. 201180068856.7 (with English translation).

International Preliminary Report on Patentability and Written Opinion dated Aug. 15, 2013 in Application No. PCT/JP2011/071776.

International Search Report dated Jan. 30, 2012 for PCT/JP2011/071776 filed Sep. 16, 2011 in English.

International Written Opinion dated Jan. 30, 2012 for PCT/JP2011/071776 filed on Sep. 16, 2011 in English.

Office Action dated Oct. 12, 2015 in Chinese Patent Application No. 201180068856.7 (with English language translation).

Extended European Search Report dated Nov. 16, 2015 in Patent Application No. 15176252.3.

Japanese Office Action dated Aug. 26, 2014 in Patent Application No. 2011-110242 (w/English translation).

Combined Taiwanese Office Action and Search Report dated May 13, 2014 in Patent Application No. 100133693 (w/English translation).

"SD Specifications Part E1 SDIO Simplified Specification", Version 3.00; Technical Committee SD Card Association; Feb. 25, 2011.

"SD Specifications Part 1 Physical Layer Simplified Specification"; Version 3.01; Technical Committee SD Card Association; May 18, 2010.

"SDIO Simple Specification Version 1.0" Secure Digital Input/Output (SDIO) Card Specification, SD Association, Version 1.0, XP002493459, Oct. 1, 2001, pp. 1-17.

* cited by examiner

| a | b | c | d | e | f | g | h |
|---|---|---|---|---|---|---|---|

| 1 | 0 | 1 | 1 | 1 | 0 | 0 | 1 |
|---|---|---|---|---|---|---|---|

| x | b | x | x | x | f | g | x |
|---|---|---|---|---|---|---|---|

| | | | |
|---|---|---|---|
| | Structure revision | 2 bytes | Revision defining Page 0 format |
| | Data length | 2 bytes | Effective data length recorded in Page 0 |
| | Number of extended functions (=N) | 1 byte | Number of extended functions supported by device |
| | Spare | 1 byte | (Adjust to make field configured in units of even number bytes) |
| Device 1 | Device 1 function identification code | 4 bytes | Use standardized device driver for extended function of standard device identification code. Set 0 to nonstandard function |
| Device 1 | Device 1 manufacturer identification information | 16 bytes | Record name of manufacturer or vendor in character string |
| Device 1 | Device 1 function identification information | 16 bytes | Provide information used to confirm whether or not dedicated driver is installed for extended function. Describe model number, revision, and the like in character string |
| Device 1 | Beginning address (Page 0) of next device | 2 bytes | When device 1 is not used, shift to checking of device 2 |
| Device 1 | Device 1 address length number (=X) | 2 bytes | Number of address length fields set below |
| Device 1 | Device 1 start address 1, length 1 | 2 bytes each | First area of extension register used by device 1. Beginning address in extension register space of pages 1 to 7, and size of extension register area to be used are shown |
| Device 1 | Device 1 start address 2, length 2 | 2 bytes each | Second area of extension register used by device 1 |
| Device 1 | ..... | | |
| Device 1 | Device 1 start address X, length X | 2 bytes each | Xth area of extension register used by device 1 |
| Device 2 | Device 2 function identification code | 4 bytes | Information area of device 2. Contents are identical to device 1 |
| Device 2 | ..... | | |
| Device 2 | Device 2 start address Y, length Y | 4 bytes | End of address length information of device 2 is shown |
| Device 2 | ..... | | |
| Device N | Device N function identification code | 4 bytes | Information area of device N. Contents are identical to device 1 |
| Device N | ..... | | |
| Device N | Device N start address Z, length Z | 4 bytes | End of address length information of device N is shown |
| | Unused area | | |

FIG. 10

| Function driver revision | Function revision of a card | | |
|---|---|---|---|
| | A | B | C |
| A | Revision A | Revision A | Revision A |
| B | Revision A | Revision B | Revision B |
| C | Revision A | Revision B | Revision C |

FIG. 16

| | | |
|---|---|---|
| Structure Revision | 2 bytes | Defines page 0 format |
| Effective length of page 0 | 2 bytes | Effective data length recorded on page 0 |
| Number of extended functions | 1 byte | The number of extended functions supported in a device |
| Reserved | 1 byte | Set to 00h (for even byte alignment) |
| Extension 1<br>Function identification code | 4 bytes | Standard function code to use standard function driver<br>Non standard function sets this field to 0 |
| Extension 1<br>Manufacturer identification info. | 16 bytes | Describe manufacturer name or seller name in ASCII<br>(not managed by SDA) |
| Extension 1<br>Function identification info. | 16 bytes | Describe function information by ASCII<br>(not managed by SDA) |
| Pointer to next extension | 2 bytes | Start address of next extension information (lower 16-bit)<br>FNO=000b, address bit 17 is always treated as 0 |
| Number of register set (=X) | 1 byte | The number of address/length pair described below |
| Reserved | 1 byte | Set to 00h (for even byte alignment) |
| Extension 1 address 1, length 1 | 4 bytes | The first register set of extension 1 |
| Extension 1 address 2, length 2 | 4 bytes | The second register set of extension 1 |
| ..... | | |
| Extension 1 address X, length X | 4 bytes | The Xth register set of extension 1 |
| Extension 2<br>Function Identification code | 4 bytes | Start of extension 2 information |
| ..... | | |
| Extension 2 address Y, length Y | 4 bytes | The Yth register set of extension 2 |
| Extension N<br>Function identification code | 4 bytes | Start of extension N information |
| ..... | | |
| Extension N address Z, length Z | 4 bytes | The Zth register set of extension N |
| Unused area | | Set to all 0 |

| 31-22 | 29-18 | 17 | 16-00 |
|---|---|---|---|
| 0000000000b | FBO/FID | 0 | Address |
| 10 bits | 4 bits | 1 bit | 17 bits |

FIG. 23

MEMORY SYSTEM IN WHICH EXTENDED FUNCTION CAN EASILY BE SET

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application is a *Reissue of U.S. Pat. No. 9,335,953, issued May 10, 2016, which is a* Continuation [application] *Application* of U.S. Ser. No. 13/956,825 filed Aug. 1, 2013 (*now U.S. Pat. No. 9,104,539 issued Aug. 11, 2015*) which is a Continuation [application] *Application* of PCT Application No. PCT/JP2011/071776, filed Sep. 16, 2011 and based upon and claiming the benefit of priority from prior Japanese Patent Applications No. 2011-023217, filed Feb. 4, 2011; and No. 2011-110242, filed May 17, 2011, the entire contents of all of which are incorporated herein by reference.

FIELD

Embodiments described herein relate generally to a memory system using, for example, a semiconductor non-volatile memory.

BACKGROUND

Recently, it is desired that a memory card be not only a mere memory device, but also be a memory device to which various functions can be added in order to impart added value to the memory card. Further, in order to make it possible to use the additional functions on a plug-and-play basis, a general-purpose initialization means is desired.

BRIEF DESCRIPTION OF THE DRAWINGS

FIG. 10 is a view showing an example of a general information field to be set to a first page of an extension register.

FIG. 16 is a view showing an example of revision management.

FIG. 23 is a view showing an example of a general information field to be set at a first page of an extension register.

DETAILED DESCRIPTION

Figure 1:
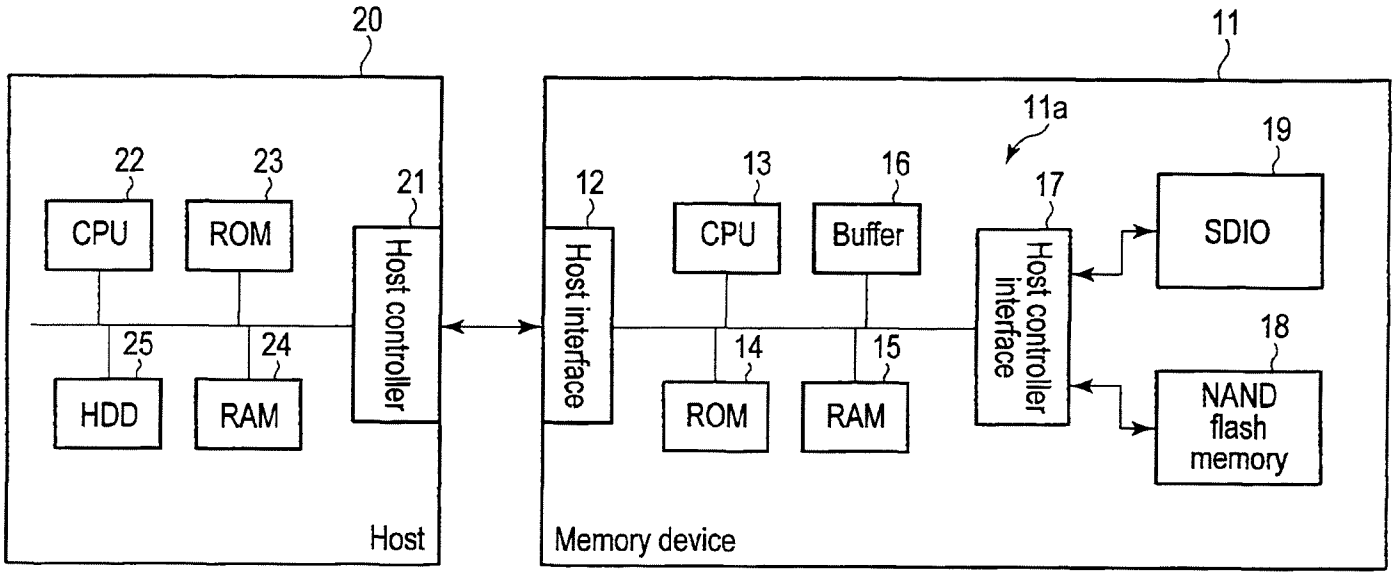
FIG. 1 is a block diagram schematically showing a memory system applied to an embodiment.

In general, according to one embodiment, a memory system includes a nonvolatile semiconductor memory device, a control section, a memory, an extended function section, and an extension register. The control section controls the non-volatile semiconductor memory device. The memory is a work area connected to the control section. The extended function section is controlled by the control section. The extension register is provided on the memory, and has a given block length which can define the extended function of the extended function section. The control section processes a first command to read data from the extension register in units of given data lengths, and a second command to write data to the extension register in units of given data lengths, extension register includes a first area, and second area different from the first area, information configured to specify a type of the extended function and controllable driver, and address information indicating a place to which the extended function is assigned, the place being on the extension register, are recorded in the first area, and the second area includes the extended function.

In a memory device such as an SD card, when the function is to be extended, a new standard is set, and the function is extended in accordance with the standard. Accordingly, without defining the standard, it has been difficult to extend the function.

For example, in a memory device such as an SD card and host apparatus, an extension method of standard functions has not been defined. Accordingly, it has not been possible to make a function added to the memory device easily usable, except in a particular host device. This has been an obstacle to addition of new functions to the memory device.

Further, as a host controller is limited in its functions, there have been cases where functions added to the memory device cannot be used. More specifically, in many cases, a host controller for a memory does not support an interrupt or is not compatible with read/write of data smaller than 512 bytes. Particularly in the SDIO standard, although multi-block transfer of a variable-length block is defined, a memory-dedicated host cannot carry out such data transfer in many cases. Accordingly, in a peripheral such as a digital camera and PHS, when a function of an SDIO card having a function of an interface or a combo-card obtained by incorporating an SDIO card into an SD card is extended, it has been necessary to install a function driver corresponding to the extended function in the host system, and it has not been possible to recognize the function driver without changing the host driver.

Further, the host uses a card address (RCA), and device ID configured to specify a card/device. Although a function can be specified by using these information items in the case of a single-function card/device, there is the problem that it is not possible to specify one of functions of a multi-function device by using only the card address. Accordingly, it has not been possible to use a multi-function device unless the software configured to manage the host system is changed so that the software can be compatible with the multi-function card/device.

Further, a controller in the memory generally accesses the memory in units of 512 bytes. Accordingly, when part of data of the 512-byte unit data is to be rewritten, a read-modify-write operation has been required. That is, for example, when 1 byte-data in the 512-byte data is to be rewritten, an operation of reading the 512-byte data into a buffer, updating the 1-byte data on the buffer, and writing the updated 512-byte data is required. Accordingly, the control efficiency has been poor.

Further, in general, when a function of a card is to be extended by using a register, a control register has been assigned to a specific address. Accordingly, it has not been possible for a card vendor to freely determine an address position used for function extension. When the extended function is to be standardized, it has been necessary to assign a plurality of functions to register addresses in such a manner that the functions are not assigned in a duplicated manner, and there has been the problem that address spaces become desultorily discontinuous depending on the supported state of the function. Further, when a vendor's original function is to be implemented too, there has been the problem that the function cannot be freely added.

Thus, this embodiment provides a function extension means which enables function extension by using a virtual extension register, and which is flexible by standardizing information by which a corresponding function driver can be found.

A schematic explanation of this embodiment is as follows.

(Function Extension Method)

When a host driver looks for a function driver configured to control the additional function, and a corresponding function driver is installed in the host, it becomes possible to easily carry out function extension by adopting a mechanism configured to transfer control to the function driver. Control peculiar to a function is hidden in the function driver, and hence it becomes possible for the host driver to implement an additional function by using only the minimum information. For example, firmware includes an extension register of a plurality of pages managed by the firmware, and provides a standard general information field configured to recognize a specific driver in page 0 of the extension register. Thereby, it becomes possible for the host system to implement the plug-and-play function. Further, by the management carried out by the host system so that each of the functions can be pointed out in order to support the multi-function card/device, it is made possible to use the multi-function card/device without changing the host software.

(Compatibility of SD Memory or SDIO Host Controller)

In the SD memory host controller too, a dedicated command configured to access an extension register by which control of an additional function can be efficiently carried out is defined. By transfer of a fixed-length block of 512 bytes, it is possible to issue the dedicated command from a conventional SD memory host controller. Furthermore, by having information about an effective data length or a masking function at the time of write as an argument of the command, it becomes possible to make the read-modify-write operation unnecessary.

In a host controller compatible with the SDIO card, by making it possible to access the extension register from the SDIO access command, it becomes possible to be compatible with short-length-block transfer and multi-block transfer, and hence it becomes possible to make a further optimized driver.

By supporting a data port serving as a data transfer port, it becomes possible to realize implementation requiring a smaller amount of the extension register space. Further, by using a data port, it becomes possible to efficiently carry out data transfer to a device other than the extension register. It is possible to support a burst transfer command by using a plurality of blocks. Regarding the data port, it is possible to define an arbitrary address of the extension register as a data port when the function is implemented. The card deciphers the address to determine whether the address is associated with a data port or an extension register.

(Definition of Extension Register by Relocatable Address)

By making it possible for the card vendor to assign a register configured to control an additional function to an arbitrary position on the extension register, and by providing address information about the implemented register from the general information field, it is made possible to make the register arrangement relocatable. Accordingly, address arrangement conventionally requiring standardization is made unnecessary, and it becomes easy to manufacture a memory device. Relocation is enabled, and hence it is easily possible, even when a register is extended, to cope with the extension.

Hereinafter, an embodiment will be described with reference to the drawings.

FIG. 1 schematically shows a memory system according to this embodiment.

The memory system is constituted of a memory device 11 such as an SD card, and host 20.

When the memory device 11 is connected to the host 20, the memory device 11 receives power supply to operate, and carries out processing corresponding to access from the host 20. The memory device 11 includes a controller 11a.

The controller 11a is constituted of, for example, a host interface 12, CPU 13, read only memory (ROM) 14, random access memory (RAM) 15, buffer 16, and memory interface 17. These are connected to each other by a bus. For example, a NAND flash memory 18, and SDIO 19 serving as an extended function section are connected to the memory interface 17. As the extended function section, for example, a wireless LAN device or the like can be adopted.

The host interface 12 carries out interface processing between the controller 11a and host 20.

The memory interface 17 carries out interface processing between the controller 11a and NAND flash memory 18 or the SDIO 19.

The CPU 13 is a unit configured to manage operations of the overall memory device 11. A program configured to control the CPU 13 executes predetermined processing by using firmware (control program and the like) stored in the ROM 14 or by loading the firmware into the RAM 15. That is, the CPU 13 creates various tables and an extension register, to be described later, on the RAM 18, receives a write command, read command or erase command from the host 20 to access an area on the NAND flash memory 18, and controls data transfer processing through the buffer 16.

The ROM 14 stores therein firmware such as a control program to be used by the CPU 13. The RAM 15 is used as a work area of the CPU 13, and stores therein a control program, various tables, and extension register to be described later.

When data sent from the host 20 is to be written to, for example, the NAND flash memory 18, the buffer 16 temporarily stores therein data of a given amount (for example, data of one page) and, when data read from the NAND flash memory 18 is to be sent to the host 20, the buffer 16 temporarily stores therein data of a given amount. Further, the buffer 16 can control the SD bus interface and back-end asynchronously by carrying out the control through the buffer.

The NAND flash memory 18 is constituted of, for example, memory cells of a stacked gate structure or memory cells of a MONOS structure.

The SDIO 19 has a function of a peripheral such as a digital camera and PHS, and function of an interface. By adopting a wireless LAN device as the SDIO 19, it becomes possible for even a digital camera having no wireless communication function to carry out data communication by wireless between itself and an external server, external PC, and the like.

As the host 20, for example, a digital camera, PHS, and the like can be adopted. The host 20 is constituted of a host controller 21, CPU 22, ROM 23, RAM 24 and, for example, hard disk 25 (including an SSD). These are connected to each other by a bus.

The CPU 22 controls the overall host. The ROM 23 stores therein firmware necessary for the operation of the CPU 22. Although the RAM 24 is used as, for example, a work area of the CPU 22, a program which can be executed by the CPU 22 is also loaded here to be executed. The hard disk 25 holds various data items. In the state where the memory device 11 is connected to the host controller 21, the host controller 21 carries out interface processing between itself and the memory device 11. Furthermore, the host controller 21 issues various commands, to be described later, in accordance with instructions from the CPU 22.

(Configuration of Firmware)

Figure 2:
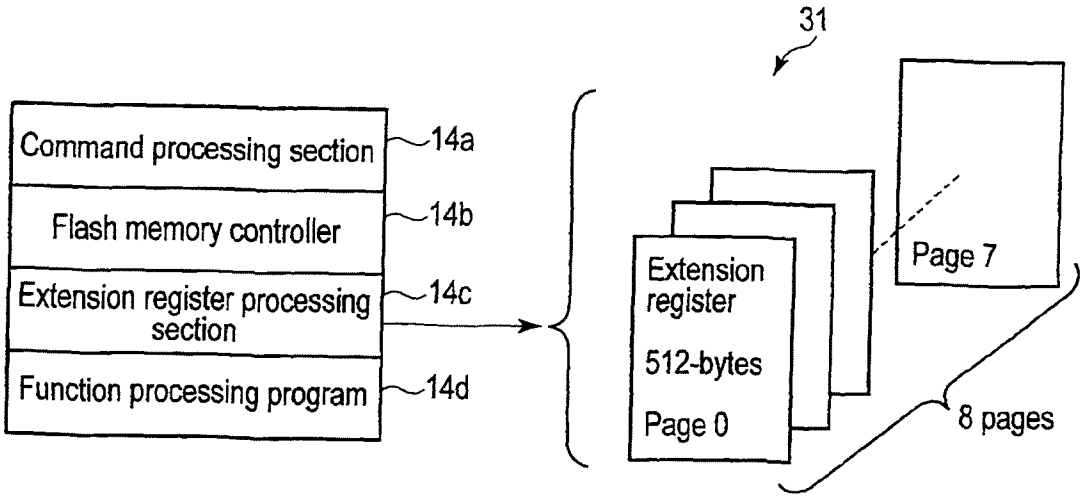
FIG. 2 is a block diagram showing an example of firmware of the memory system shown in FIG. 1.

FIG. 2 shows an example of the functional configuration of the firmware stored in the ROM 14 of the memory device 11. These functions are realized by the combination of the hardware items such as the CPU 13 and the like constituting the controller 11a. The firmware is constituted of, for example, a command processing section 14a, flash memory controller 14b, extension register processing section 14c, and function processing program 14d. When the memory device 11 is activated, the extension register processing section 14c creates an extension register 31 in the RAM 15. The extension register 31 is a virtual register, and is enabled to define an extended function. In the embodiment, the extension register is not limited to the virtual register. It is possible to provide the extension register as hardware in the CPU 13, for example.

(Configuration of Extension Register)

As shown in FIG. 2, the extension register 31 is constituted of, for example, eight pages. One page is constituted of 512 bytes. In order to access the 512-byte extension register in units of one byte, addresses of at least 9 bits are required and, in order to access the eight pages, addresses of at least 3 bits are required. By the addresses of a total of 12 bits, all the spaces of the extension register are made accessible. Although 512 bytes is an access unit which can be supported by almost all hosts, the access unit is not limited to 512 bytes, and may be made larger than 512 bytes. When the extension register 31 is constituted of an address field of a long bit length, some lower bits are used as an access unit, and remaining upper bits are used to select one of a plurality of pages.

The reason for making the 512 bytes a unit is that the configuration is made in such a manner that a large number of memory card host controllers carry out read/write transfer by using one block (=512 bytes) as a unit. Although a host controller compatible with the SDIO can carry out read/write in units of one byte, not all the host controllers support the above read/write. In order to enable the great majority of the host controllers to control the extended function, it is convenient if access can be carried out in units of 512 bytes.

Of the eight pages (page 0 to page 7), page 0 is an area configured to record a general information field in order to carry out the plug-and-play operation of the extended function. Details of the general information field will be described later. In pages 1 to 7, registers configured to control the extended functions are defined. A position can easily be specified in page 0, and hence page 0 is a suitable place to record the general information field, but the page in which the general information field is to be recorded is not necessarily limited to page 0, and a position in a specific page can be defined as a place configured to describe the general information field.

For read/write of the extension register, dedicated read/write commands to be defined as follows are used. These commands each have a first operation mode in which read/write of the extension register is carried out, and second operation mode in which a data port is configured.

(Read Command (CMD 48) of Extension Register)

Figure 3:
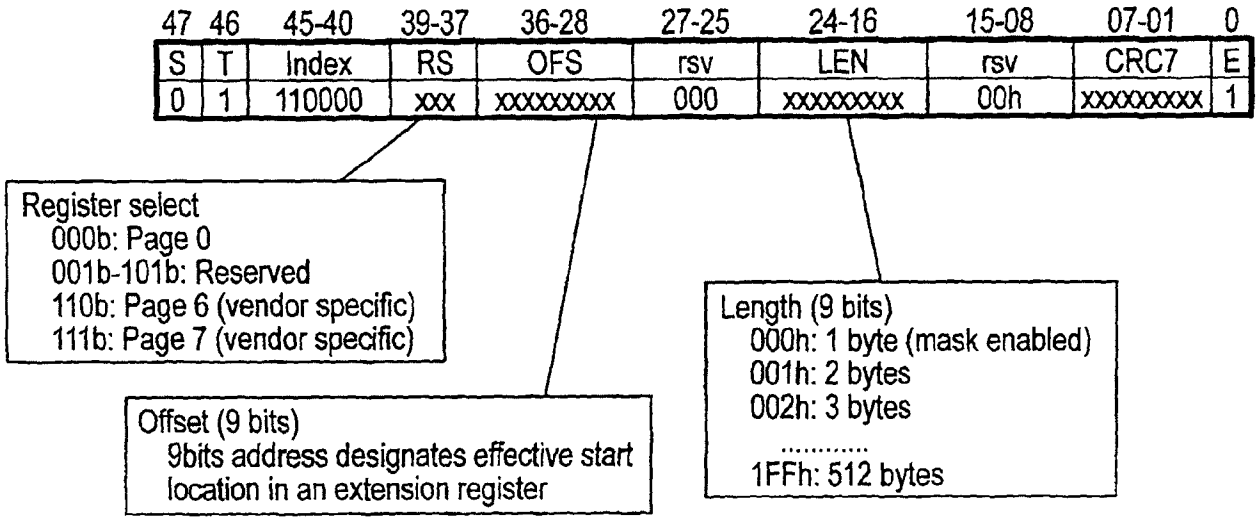
FIG. 3 is a block diagram showing an example of a read command of an extension register.

FIG. 3 shows an example of the field configuration of a read command (CMD 48) of the extension register. "S" indicates a start bit of the command, "T" is a bit indicating the transfer direction, and "index" indicates the command number. "RS" (register select) indicates a page in the extension register 31, and "OFS" indicates a position (offset from a head of the page) of data in the selected page. By using "RS" of 3 bits, and "OFS" of 9 bits, a space corresponding to the 8 pages of the 512-byte extension register can be specified in units of one byte. More specifically, a read start position in the selected extension register is designated by "RS" and "OFS".

"LEN" indicates the data length. An effective data length necessary for read in the 512-byte extension register is designated by the 9-bit LEN field.

"CRC7" indicates a cyclic redundancy check code, and "E" indicates an end bit of the command. Further, "rsv" indicates a spare bit.

(Read Command of Extension Register, First Operation Mode)

Figure 4:
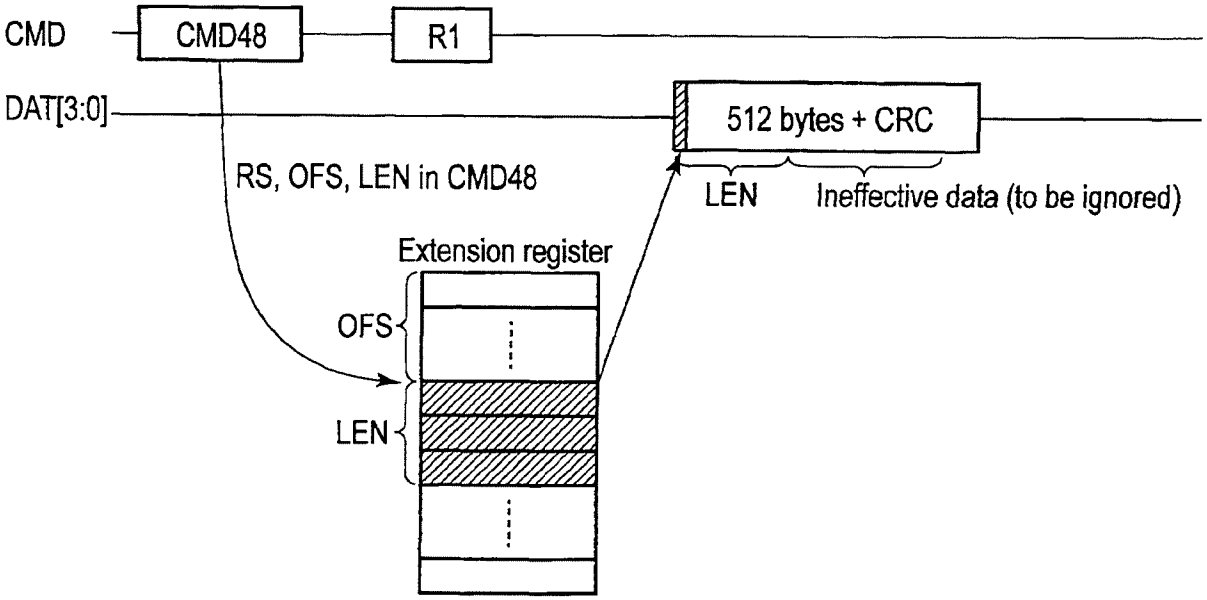
FIG. 4 is a timing chart showing a read operation of an extension register to be carried out by a read command.

FIG. 4 shows an example of a read operation of an extension register to be carried out in the first operation mode.

As shown in FIG. 4, upon receipt of a command (CMD 48) from the host 20, the memory device 11 returns a response (R1) to the host 20 and, thereafter reads a 512-byte data block from the extension register 31.

More specifically, by the arguments of the command (CMD 48), i.e., by "RS" and "OFS", a page in the extension register, and position of data to be read in the page are designated, and data length is designated by "LEN". In the manner described above, the data in the designated extension register is set to the head of the 512-byte data block, and is read. Among data items in the 512-byte data block, data items having data lengths exceeding a data length specified by "LEN" become ineffective data items. A CRC code is added to the last part of the data block to make it possible to check whether or not the data has been properly received (checking of data is carried out by including ineffective data). Effective data items are arranged from the head, and hence it is not necessary for the host 20 to carry out an operation such as data shift or the like in order to look for effective data.

(Read Command of Extension Register, Second Operation Mode)

Figure 5:
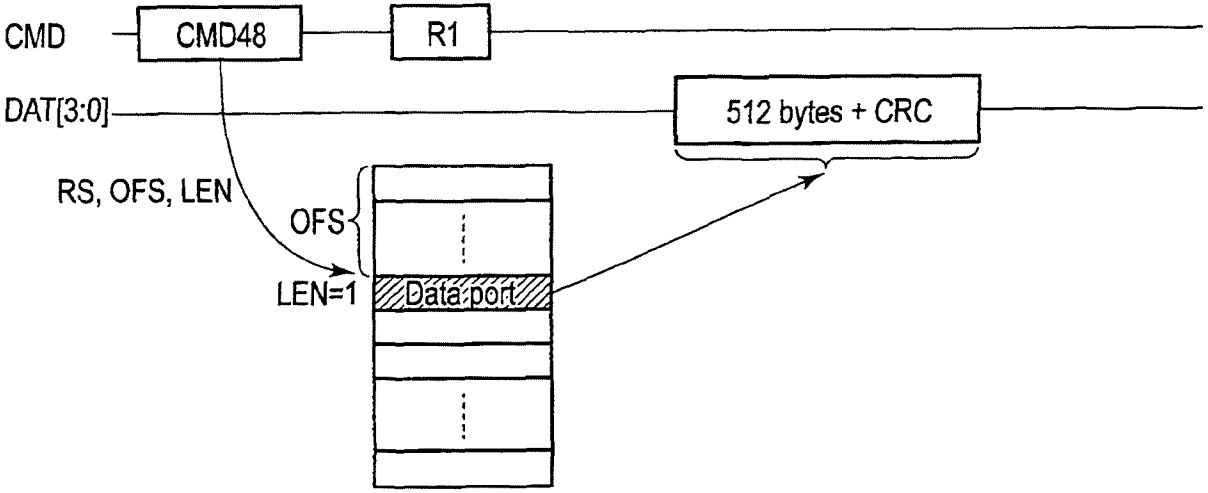
FIG. 5 is a timing chart showing a read operation of a data port to be carried out by a read command.

FIG. 5 shows an example of an operation of data port read to be carried out in the second operation mode.

Upon receipt of the command (CMD 48), the memory device 11 returns a response (R1) and, thereafter returns the 512-byte data block.

By arguments "RS" and "OFS" of the command, a position in a selected page of the extension register is designated. In FIG. 5, a data port example of a case where the length is "1" is shown. That is, it is sufficient if the data port occupies only an address of one byte on the extension register map. Further, it is sufficient if it is possible to distinguish whether or not an address is a data port by decoding of the address, and it is not necessary for the data to be actually transmitted through the 1-byte width port, and hence the data transmission performance is not adversely affected. It is possible to read data of one block (512-byte unit) from the device assigned to this data port. That is, it is possible to read data of one block (512-byte unit) at one time. The read data is held in, for example, the buffer 16, and is then read by the host 20.

When the same data port is subsequently read, the subsequent 512-byte data can be read. The place from which data to be read from the data port is taken can be freely defined by the specification of the extended function. Regarding data port control, the control can be carried out by defining a control register on, for example, the extension register. A CRC code is added to the last part of the 512-byte data block to make it possible to check whether or not the data has been properly received.

(Write Command (CMD 49) of Extension Register)

Figure 6:
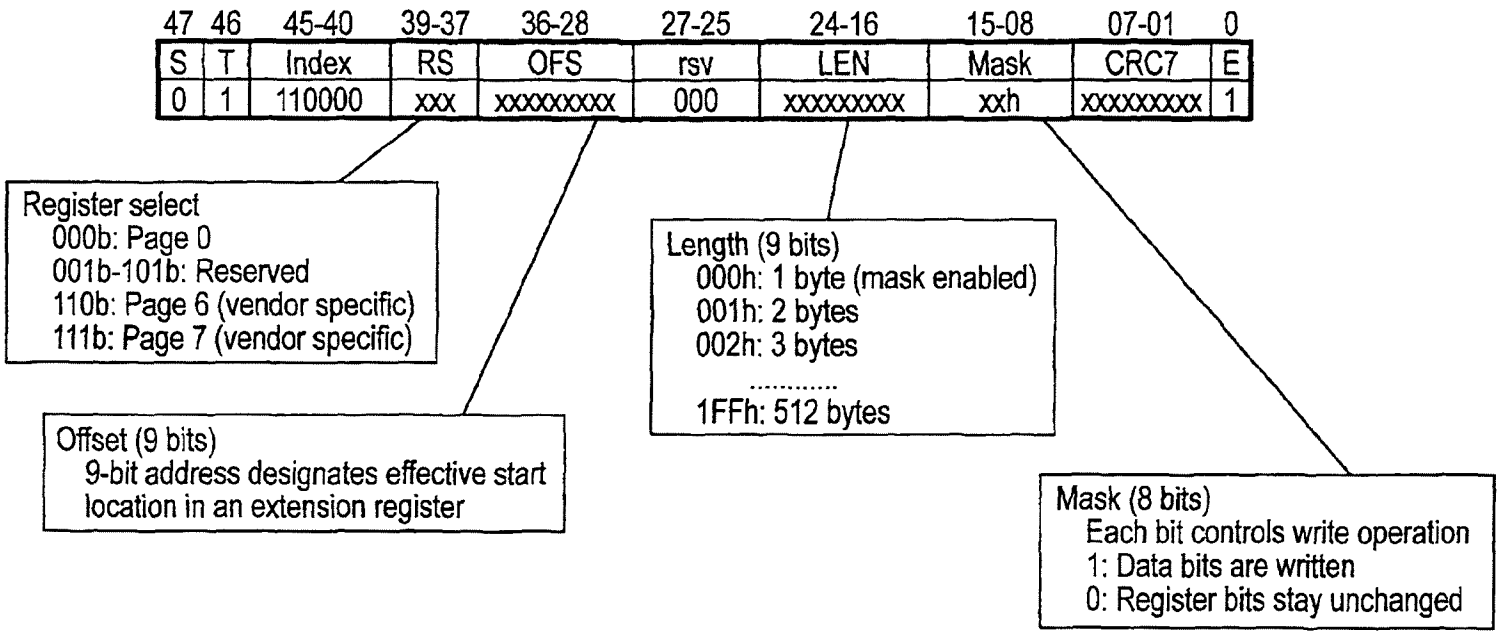
FIG. 6 is a block diagram showing an example of a write command of an extension register.

FIG. 6 shows an example of a write command of the extension register. In the write command (CMD 49), parts identical to the read command (CMD 48) are denoted by identical reference symbols. The write command and read command are distinguished from each other by "index". By using "RS" of 3 bits, and "OFS" of 9 bits, a page in the extension register, and position of data in the selected page are designated. A length of data to be written to the 512-byte extension register is designated by a "LEN" field of 9 bits. Accordingly, it is possible to write data of an arbitrary data length (byte unit) within 512 bytes to an arbitrary page and place of the extension register.

The write command (CMD 49) is provided with a mask register in the argument of the command. That is, "Mask" indicates an 8-bit length mask register. By the mask register, it becomes possible to carry out an operation in units of one bit in data write of one byte, and write data to only a specific bit. Accordingly, in a bit operation within one byte, it is not necessary to carry out the read-modify-write operation.

When the data length is one byte, i.e., in the case of "LEN=0" (length 1), the mask register becomes effective. Regarding a bit of the mask register "Mask" having data of "1", data is written to the bit, and regarding a bit of the mask register "Mask" having data of "0", the value already set is retained.

Figures 7A, 7B, 7C, 8:
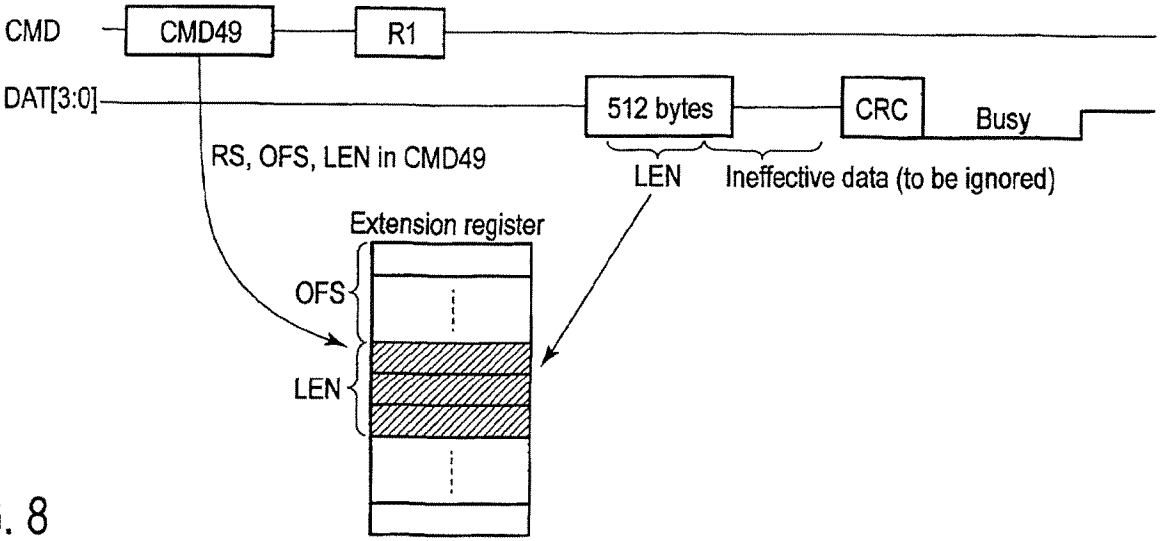
FIGS. 7A, 7B, and 7C are views each showing an operation of a mask register.
FIG. 8 is a timing chart showing a write operation of an extension register to be carried out by a write command.

That is, when an extension register holding data shown in FIG. 7A is assumed, if data of the mask register is as shown in FIG. 7B, by executing a write command, data is written to a bit of the mask register having data of "1" as shown in FIG. 7C, and in a bit having data of "0", the original data is retained. Accordingly, it becomes possible to rewrite only the desired bits without carrying out the read-modify-write operation. The parts each indicated by "x" show the bits to which new data is written.

Further, when longer mask data can be supplied by a separate means, even in the case of LEN larger than 1 (LEN>1), although mask write is enabled, in the example shown in FIGS. 7A, 7B, and 7C, mask data is assigned to the command arguments, and hence the 8-bit mask is used.

(Write Command of Extension Register, First Operation Mode)

FIG. 8 shows an example of a write operation of the extension register to be carried out in the first operation mode.

Upon receipt of the command (CMD 49), the memory device 11 returns a response (R1) and, thereafter receives a 512-byte data block.

The memory device 11 returns a CRC code indicating whether or not the data block has properly been received to the host 20. Thereafter, the memory device 11 returns information indicating the busy state until the processing of the command is completed, and notifies the host 20 of the timing at which the host 20 can issue the next command. The data block is held in the buffer 16.

In the command processing, a page and position in the extension register are designated by the arguments "RS" and "OFS" of the command, and data length is designated by "LEN". Among the data blocks held in the buffer 16, data items each having a length designated by "LEN" are written to the extension register from the head thereof. Data in the data blocks having a length exceeding the data length designated by "LEN" is discarded as ineffective data.

By arranging effective data items from the head of the data block, it becomes unnecessary for the host system to carry out an operation of arranging the effective data items in the middle of the data block.

(Write Command of Extension Register, Second Operation Mode)

Figure 9:
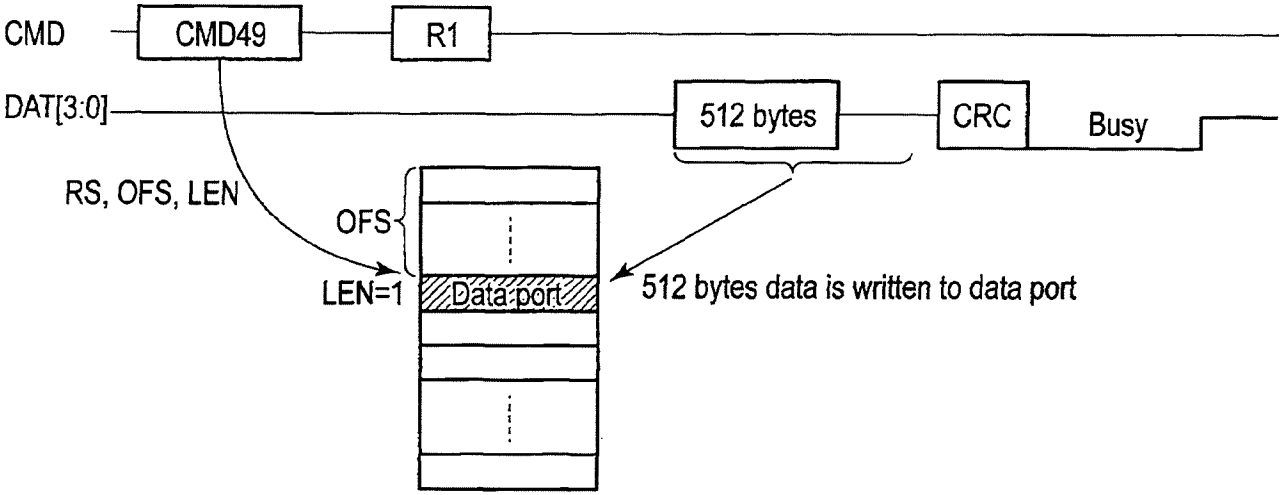
FIG. 9 is a timing chart showing a write operation of a data port to be carried out by a write command.

FIG. 9 shows an example of an operation of a write data port to be carried out in the second operation mode.

Upon receipt of the command (CMD 49), the memory device 11 returns a response (R1) and, thereafter receives a 512-byte data block.

The memory device 11 returns a CRC code indicating whether or not the data block has properly been received to the host 20. Thereafter, the memory device 11 returns information indicating the busy state until the processing of the command is completed, and notifies the host 20 of the timing at which the host 20 can issue the next command. The data block is held in the buffer 16.

In the command processing, a page and position in the extension register are designated, and a data port is designated by the arguments "RS" and "OFS" of the command. It is sufficient if the data port occupies only an address of one byte on the extension register map. It is possible to write data of one block (512-byte unit) held in the buffer 16 to a certain device assigned to this data port. That is, it is possible to write data of one block at one time.

When the same data port is subsequently written, the subsequent 512-byte data can be written to the device to which the data is assigned. The place to which the data of the data port is delivered can be freely defined by the specification of the extended function. Regarding data port control, the control can be carried out by defining a control register on, for example, the extension register.

(Usage Example of General Information Field)

FIG. 10 shows an example of the general information field shown in page 0 of the extension register 31. By making it possible for the host 20 to specify a driver configured to control the extended function by using the general information field, it is possible for the host system, when an extended function is added, to easily use the extended function, and realize plug-and-play.

A sequence example to be processed by a standard host driver will be described below with reference to FIG. 10.

(Structure Revision)

A structure revision is a revision configured to define the format of page 0 of the extension register 31. When new information is added to the general information field, which version of the general information field is held is indicated by updating the structure revision. The function host driver of the previous version ignores the new field.

(Data Length)

As a data length, the effective data length recorded in page 0 is shown.

(Number of Extended Functions (=N))

The number of extended functions indicates the number of extended functions supported by the device. At the time of start-up, the host driver repetitively checks whether or not drivers for extended functions are installed the number of times corresponding to the number of supported functions.

(Device 1 Function Identification Code)

When a code is set to the device 1 function identification code, it is indicated that the standard driver can be used. When the OS supports the standard driver, the device can be used without installing a dedicated driver. When a dedicated driver is installed, the dedicated driver is preferentially used. In the case of a nonstandard function, "0" is set to this field. In this case, this function is controlled by only a dedicated driver.

(Device 1 Manufacturer Identification Information, Device 1 Function Identification Information)

Each of the device 1 manufacturer identification information, and device 1 function identification information is information configured to specify a dedicated driver and, in these fields, a name of the manufacturer, and name of the distributor or identification information of the extended function are described by using, for example, an ASCII character string. On the basis of these information items, the host driver checks whether or not a dedicated driver of the device 1 is installed.

As the function identification information, a model number of the device, revision, and the like are described by using, for example, an ASCII character string.

(Beginning Address of Next Device)

The beginning address of the next device indicates an address in page 0 in which device information of the next device is described. When the host system does not support this device, this device cannot be used, and hence the next device is checked. The fields after this are of a variable length, and hence definition is set to this position.

(Device 1 Address Pointers 1 to X, Length Fields 1 to X)

The device 1 address pointers 1 to X, and length fields 1 to X indicate that a plurality of extension register areas can be defined for one function. The addresses and lengths are enumerated below. The length field may not necessarily be required information and this field can be omitted.

(Device 1 Address Pointer 1 (Start Address), Length 1)

The first area of the extension register used by the device 1, beginning address in the space of pages 1 to 7 of the extension register, and size of the used extension register area are indicated.

That is, one or a plurality of extension register areas can be assigned to one device, and the address pointer indicates a place (start address) of an arbitrary extension area other than page 0. The length indicates a size for occupying the extension register having the pointer at the beginning address.

(Device 1 Address Pointer 2 (Start Address), Length 2)

A position and area size of the second area in the extension register assigned to the device 1 are indicated. Thereby, an application in which, for example, the standard driver carries out control in only the first area, and a dedicated driver is enabled to efficiently carry out control by using the first area and second area is enabled.

(Device 1 Address Pointer X (Start Address), Length X)

A position and area size of the Xth area assigned to the device 1 are indicated.

As described above, a plurality of areas can be defined in the extension register. The areas are arranged in such a manner that they do not overlap each other. It is possible to check whether or not there is overlap between the areas by using the length information.

When an additional field becomes necessary, the additional field is additionally defined after this. A host which cannot recognize a new field reads the recognizable fields, and ignores the additional field. A skip can be carried out by using the above-mentioned (beginning address of the next device) field.

(Operation of Read Command (CMD 48))

Figure 11:
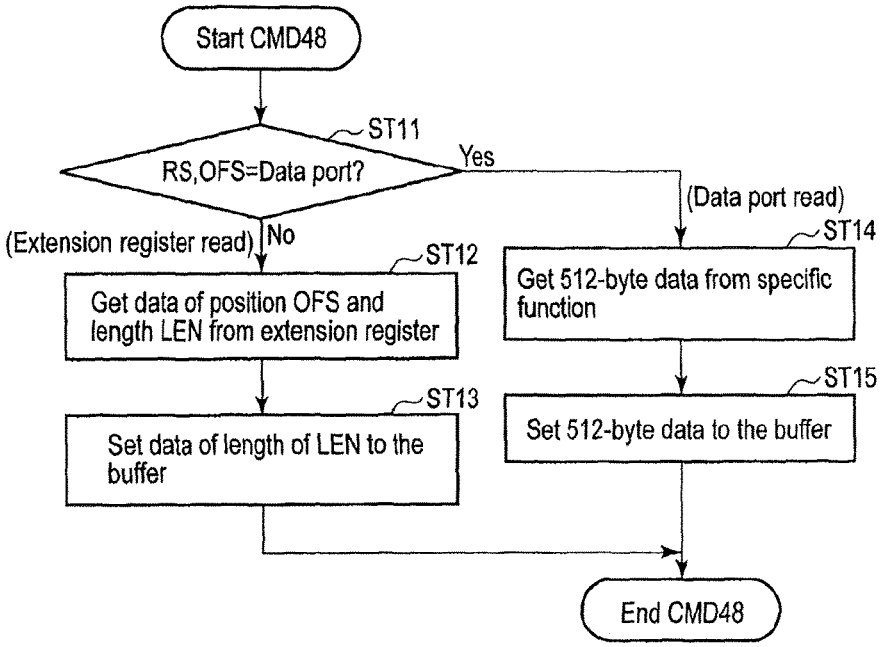
FIG. 11 is a flowchart showing an example of an operation of a memory system conforming to a read command.

FIG. 11 shows an operation of the controller 11a in the memory device 11 compatible with the read command (CMD 48).

When the read command is received, the arguments "RS" and "OFS" of the command are analyzed by the CPU 13, and it is determined whether or not the read command is read from the data port (ST11). That is, a page "RS" in the extension register, and position of data in the page are determined. As a result, when it is determined that the read command is read from the extension register, data having a data length "LEN" is acquired from a position indicated by "OFS" in the selected page of the extension register 31 (ST12). The acquired data is set to the buffer 16 (ST13).

On the other hand, when it is determined in step ST11 that the read command is read from the data port, data of 512 bytes is acquired, in the second operation mode, from a specific function of, for example, the SDIO 19 through a data port of a position indicated by "OFS" of the selected page of the extension register 31 (ST14). The acquired data is set to the buffer 16 (ST15).

(Operation of Write Command (CMD 49))

Figure 12:
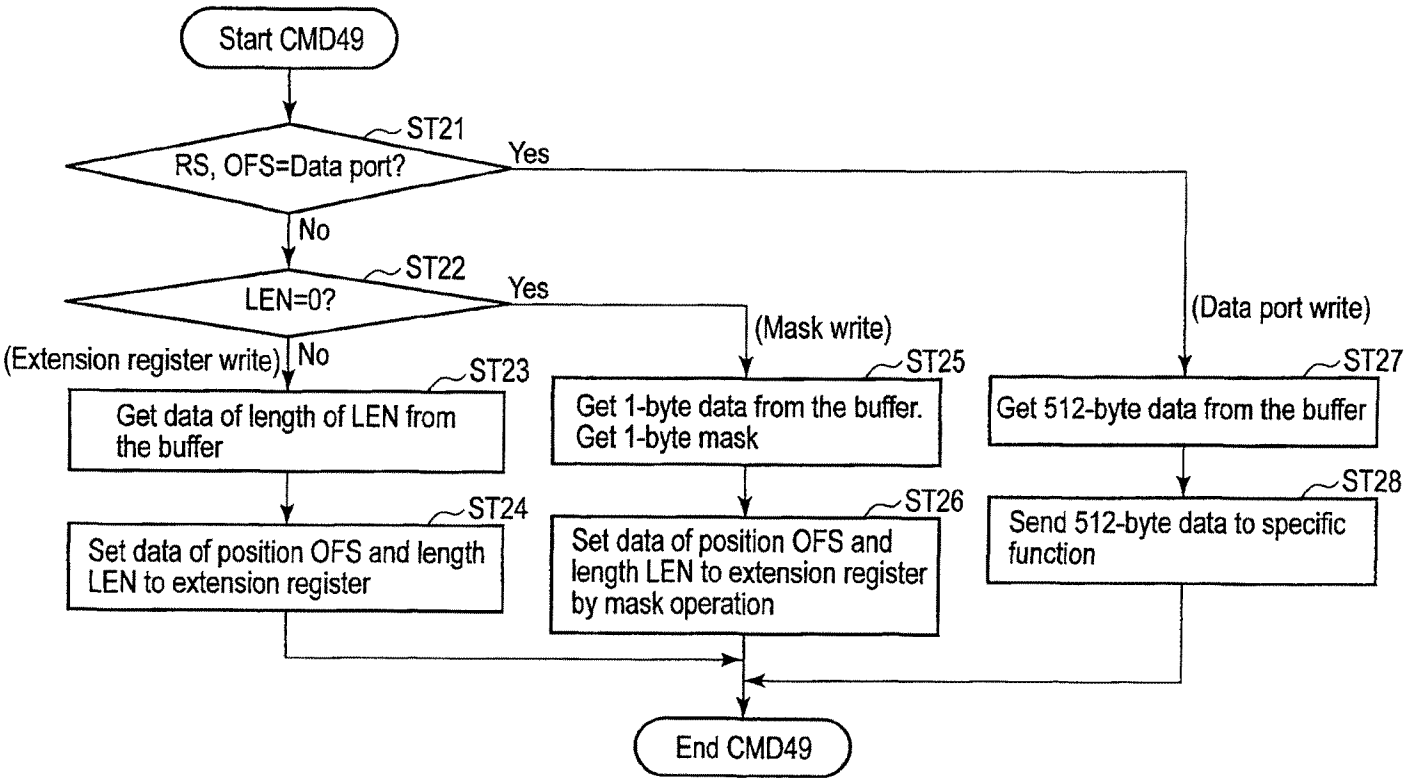
FIG. 12 is a flowchart showing an example of an operation of a memory system conforming to a write command.

FIG. 12 shows an operation of the controller in the memory device 11 compatible with the write command (CMD 49).

When the write command is received, the arguments "RS" and "OFS" of the command are analyzed by the CPU 13 (command processing section 14a), and it is determined whether or not the write command is write to a data port (ST21). That is, a page "RS" in the extension register, and position of data in the page are determined. When it is determined, as a result, that the write command is write to a part other than the data port, it is determined whether or not the argument "LEN" of the command is 0 ("LEN"=0) (length 1), i.e., whether or not the mask is effective (ST22). When it is determined, as a result of the determination, that "LEN" is not 0 (length is greater than 1), write processing of the extension register is carried out by the extension register processing section 14c. That is, data of a length designated by "LEN" is acquired from the buffer 16 (ST23). The acquired data is set to a position designated by "OFS" in the page of the extension register selected by "RS".

On the other hand, when it is determined in step ST22 that "LEN" is 0 ("LEN=0") (length is 1), and the mask is effective, data of 1 byte, and a mask of 1 byte are acquired from the buffer 16 by the extension register processing section 14c (ST25). By using the 1-byte data, and 1-byte mask, a mask operation shown in FIGS. 7A, 7B, and 7C is executed, and part of the data of the position designated by "OFS" in the page of the extension register selected by "RS" is rewritten (ST26).

Further, when it is determined in step ST21 that the write command is write to the data port, data of 512 bytes is acquired from the buffer 16 (ST27). The acquired data is transferred to a specific function of, for example, the SDIO 19 through a data port of the position indicated by "OFS" in the selected page of the extension register 31 (ST28).

(Host Driver Processing)

Figure 13:
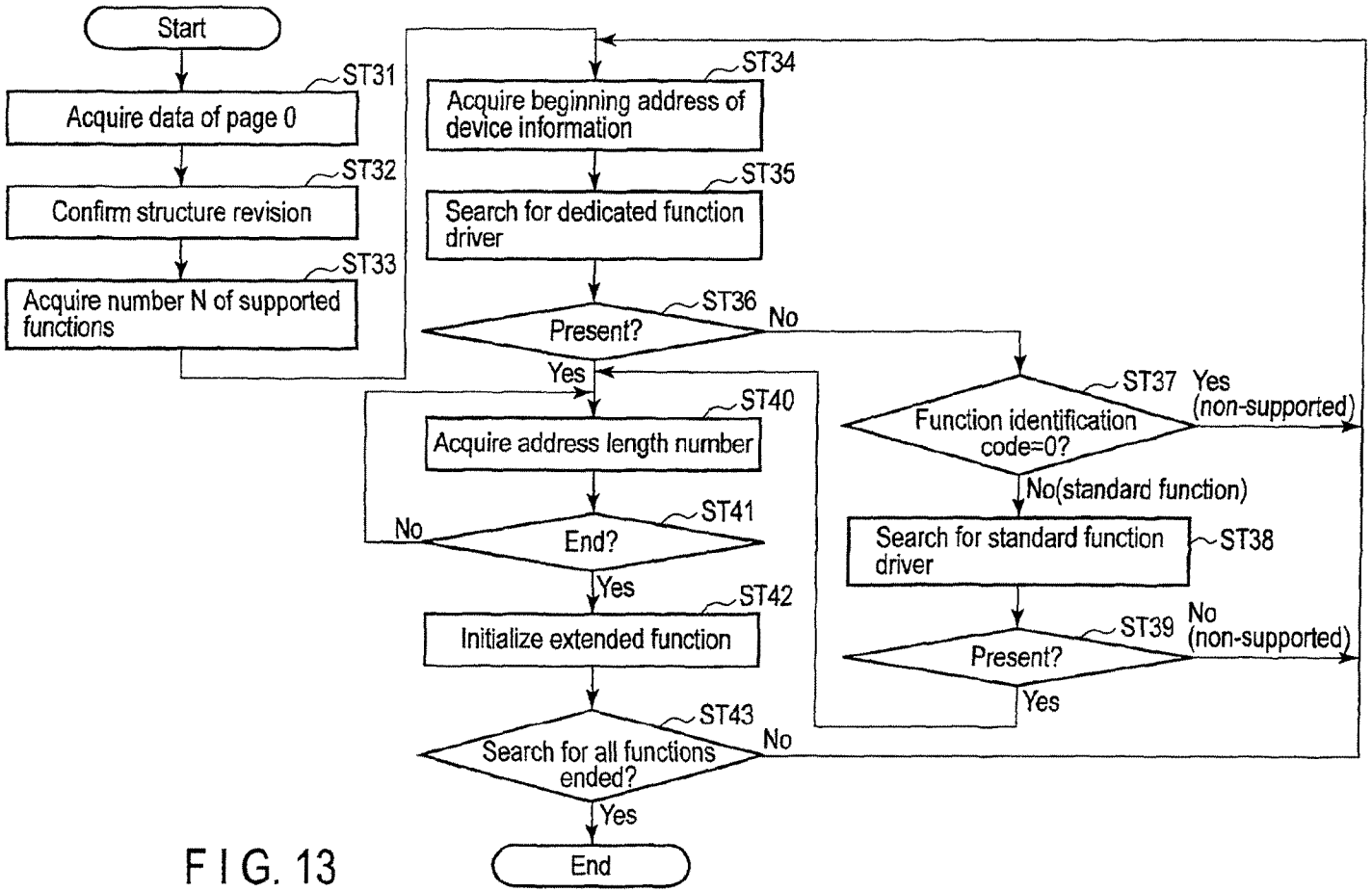
FIG. 13 is a flowchart showing an example of an operation of a host driver.

FIG. 13 shows processing of the host 20. When the memory device 11 is connected to the host 20, the memory device 11 is activated, and extension register 31 is spread on the RAM 15 of the memory device 11. The host device 11 first issues a read command (CMD 48) by using the host driver, and acquires data of page 0 of the extension register 31 (ST31). Then, the structure revision of the acquired page 0 is confirmed, and it is further confirmed which version of the general information field is held (ST32). After this, the number of supported functions N, and beginning address of the device information are acquired (ST33, ST34).

Subsequently, it is checked, by a search, whether or not a dedicated function driver corresponding to the acquired extended function is installed in the host 20 (ST35, ST36). When there is no dedicated function driver as a result of the checking, it is further determined whether or not the function identification code described in page 0 of the extension register is "0" (ST37). As a result, when the function identification code is "0", the extended function is not supported, and hence it is recognized that this device cannot be used, whereby the processing is shifted to a search for a driver for the next device (ST34).

Further, as a result of the determination of step ST37, when the function identification code is not "0", the standard function driver installed in the host 20 is searched for (ST38, ST39). As a result, when there is no standard function driver, this extended function is not supported, and hence it is recognized that the device cannot be used, whereby the processing is shifted to a search for a driver for the next device (ST34).

Further, as a result of the search of steps ST35, and ST36, when there is a standard function driver, and as a result of the search of steps ST35, and ST36, when there is a dedicated function driver, an address of the device, and length number described in page 0 are acquired (ST40). This operation is executed the number of times corresponding to the number of the addresses and lengths (ST41).

After this, the retrieved dedicated function driver or the standard function driver is loaded from, for example, the hard disk 25 of the host 20 into the RAM 24, an address pointer (start address) of one or a plurality of extension areas described in page 0 is delivered to the function driver, and an extended function is initialized (ST42). The address and length information is delivered when the function driver loaded into the RAM 24 is executed. Although there is the possibility of the standard function driver, and dedicated function driver differing from each other in the number of deliverable address and length information items, the information items are delivered by the number of the deliverable items in the order registered in page 0. Accordingly, the firstly registered address and length area serves as a common function register, and address and length area registered later can fill a role of an option.

Initialization is carried out by the function driver. That is, on the basis of the start address delivered from the host driver, the function driver accesses the extension register to which the function is assigned to initialize the device. In the initialization operation, it is necessary to consider the power consumption of the device. This is because the device must be used within the range of power which can be supplied by the host. When the device has a plurality of power modes, it is necessary to select a power mode lower than the device power which can be supplied by the host. The host system transmits the power which can be supplied by the host system to the function driver by a separate means, whereby selection of the power mode is enabled.

The operation of above steps ST34 to ST43 is repeated until the number of supported functions N is reached (ST43).

It should be noted that when, for example, a new field is added to page 0, processing of the new field is added to a part between step ST40 and step ST41. A host driver which cannot recognize the new field is configured to skip the field.

As described above, the host 20 acquires the information of page 0 of the extension register 31 and, on the basis of the information, retrieves the driver, whereby plug-and-play can be realized. Further, unlike in the conventional case, the device vendor can define a function at an arbitrary position in the extension register without the need for determining the fixing position of the extension register, and hence function extension can easily be implemented.

Figure 14:
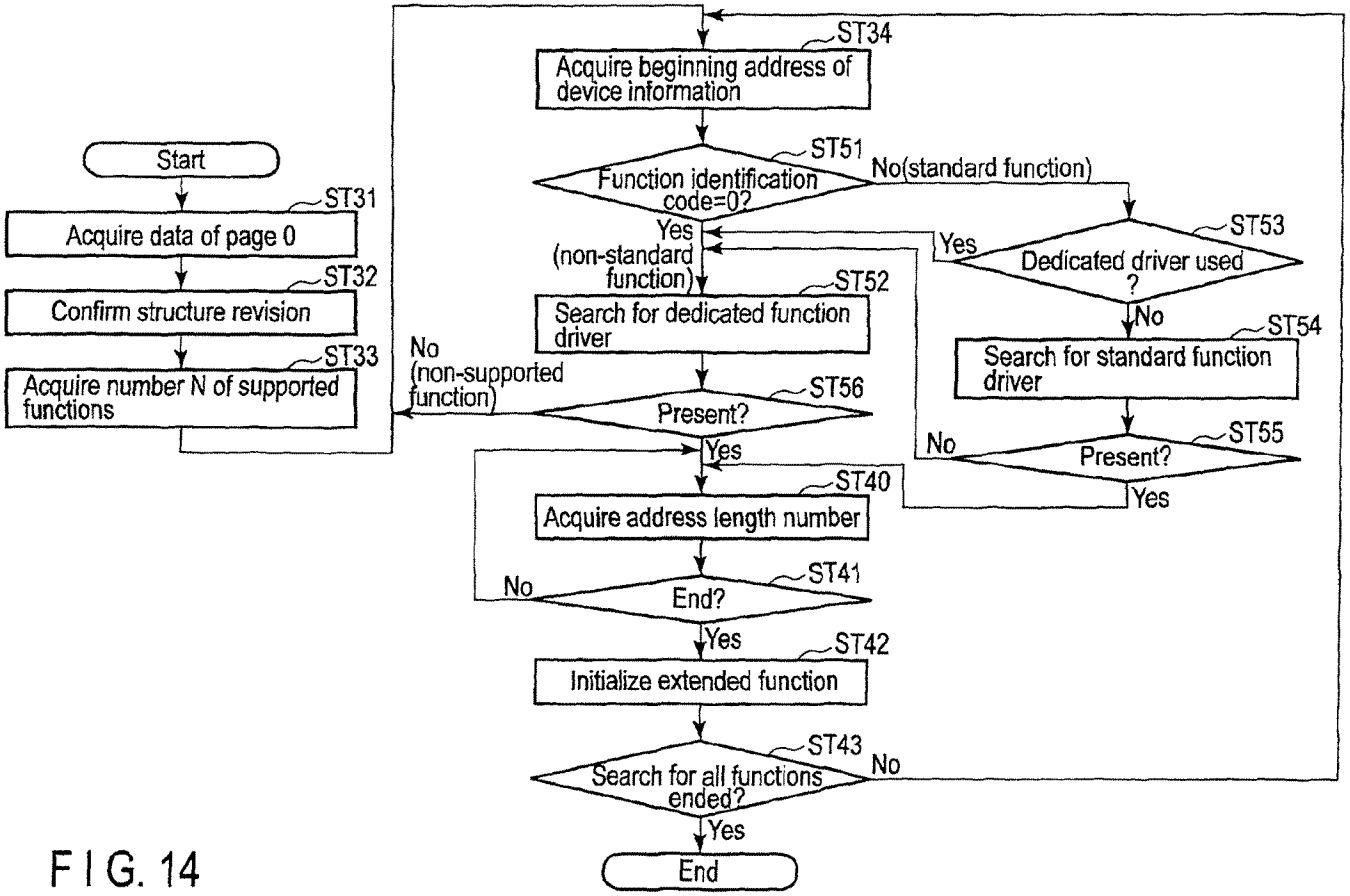
FIG. 14 is a flowchart showing another example of an operation of a host driver.

FIG. 14 shows a modification example of FIG. 13, parts identical to FIG. 13 are denoted by identical reference symbols, and only different parts will be described below.

In FIG. 14, the dedicated function driver, and standard function driver are different from each other in the search processing. That is, in step ST34, after the beginning address of the device information is acquired, first, it is determined whether or not the function identification code is "0" (ST51). As a result of the determination, when the function identification code is not "0", i.e., when the function is the standard function, it is further determined whether or not a dedicated driver is to be used (ST53). As a result of the determination, when the dedicated driver is not used, a standard function driver is searched for (ST54, ST55). When there is no standard function driver as a result of the search or when it is determined in step ST53 that the dedicated function driver is used, the dedicated function driver is searched for (ST52, ST56). When there is the dedicated function driver as a result of the search or when there is the standard function driver in step ST55, the address and length number is acquired as described previously (ST40).

By the above operation too, it is possible to realize plug-and-play as in the case of FIG. 13.

It should be noted that in the above description, it has been described that the extended function driver is installed in the host 20, and searches the inside of the host 20. However, the configuration is not limited to this, and the extended function driver may also be stored in the memory card 11. In this case, the memory card 11 is also made the search object of the extended function driver.

Figure 33:
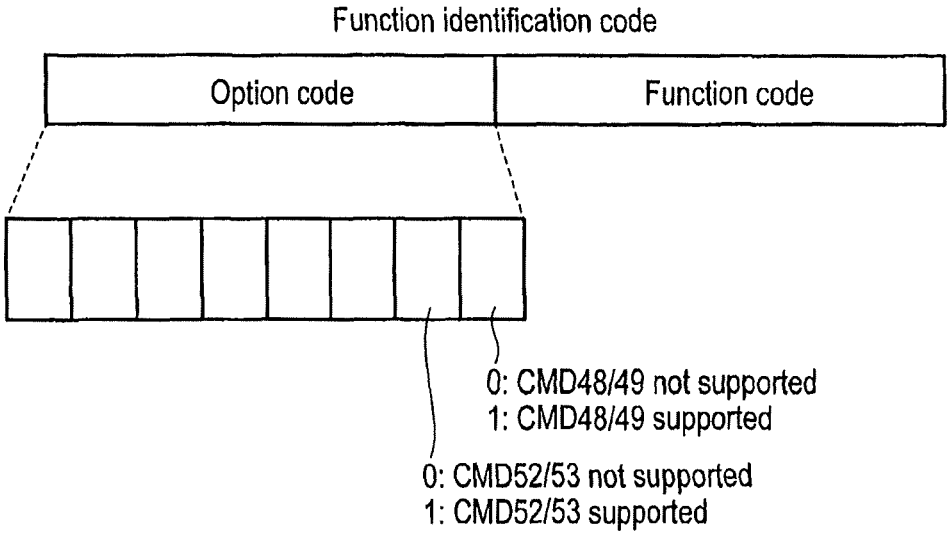
FIG. 33 is a view showing an example of a function identification code.

FIG. 33 shows information for specifying function drivers when a card has options and the function drivers differ according to the options. As shown in FIG. 33, a function identification code indicates two kinds of information, an option code and a function code. The function code indicates a standardized specific functional specification, and the kind of option is also defined by the functional specification. The option code is information which indicates whether an option implemented in the card affects the function driver. This example shows the information on whether CMD48/49 are supported and the information on whether CMD52/53 are supported. When the option code is 1 byte, the driver using CMD48/49 is denoted by "01h" ("h" indicates a hexadecimal number), and the driver using CMD52/53 is denoted by "02h". When installing the function driver in a host system, these codes are registered as a functional driver implementing code. The host system with which two drivers are installed has the both option codes "01h" and "02h".

In a card designed in order to use CMD48/49, "01h" is indicated in the option code. The host system selects a driver for CMD48/49 based on the option code. Moreover, In a card designed in order to use CMD52/53, "02h" is indicated in the option code. The host system selects a driver for CMD52/53 based on the option code.

It is important that the host driver does not need to have the information about the options, and a general-purpose host driver can be made. The information about the options is given to the host system when a function driver is installed. Since a host driver does not need for the information about the options, the host driver does not need to update a host driver when a new card is installed. The function specification can decide contents of the options freely, and by installing two or more function drivers corresponding to the combination of the options in the host system, the optimal function driver can be selected according to the support state of the card.

(Access to Extension Register in SDIO)

Figure 15:
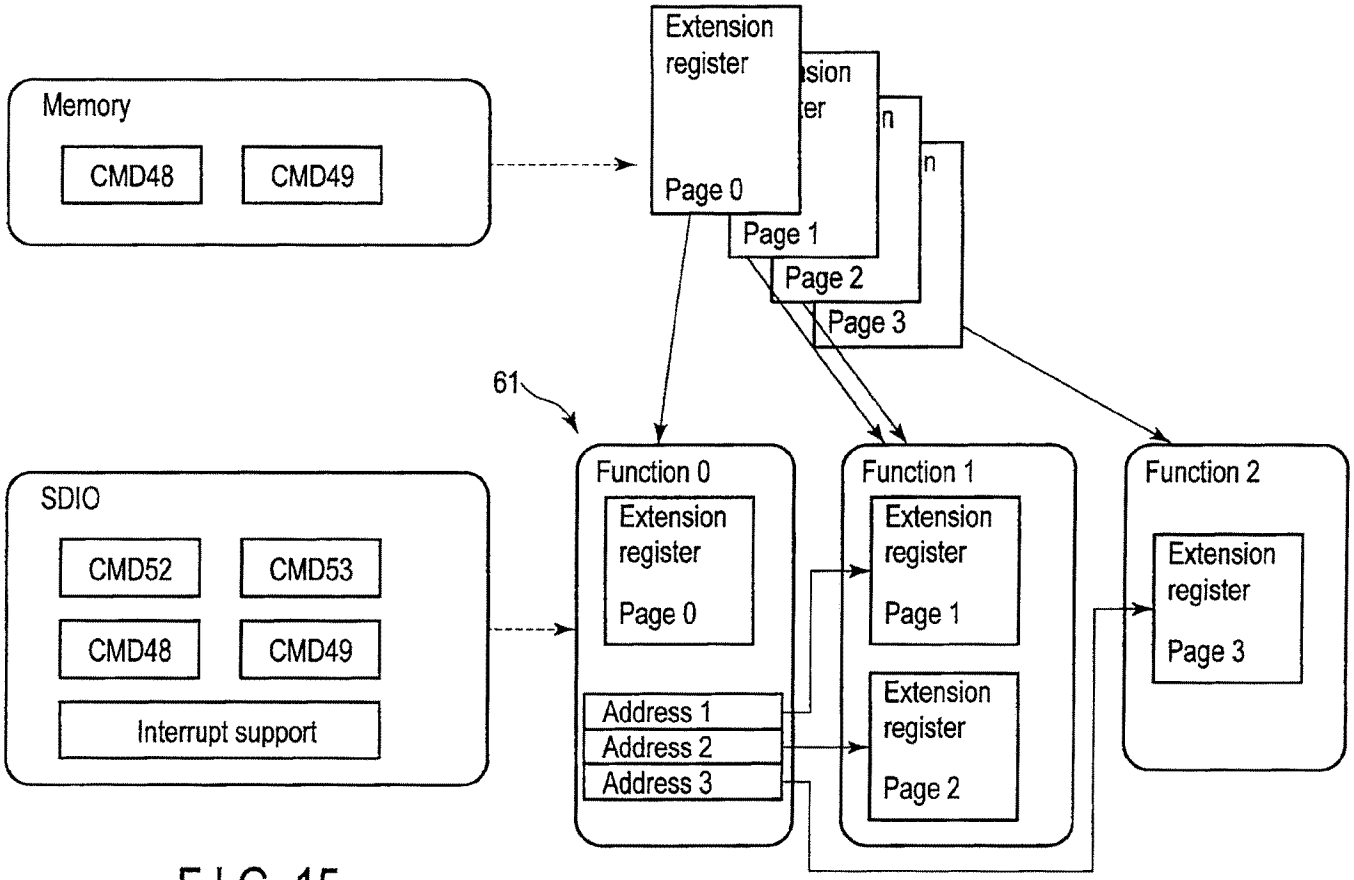
FIG. 15 is a view schematically showing an access operation of an extension register in the SDIO.

FIG. 15 shows access to the extension register in the SDIO.

A host controller compatible with the SD memory card can access the extension register by using commands CMD 48 and CMD 49, and control the extended function. That is, the host controller supports the fixed-length block transfer and single-block transfer.

On the other hand, a host controller compatible with the SDIO card is enabled to access the extension register by using the commands CMD 48 and CMD 49, and the extension register is mapped onto each function area of the SDIO, whereby it becomes possible for the host controller to access the extension register also from the SDIO commands CMD 52 (write command), and CMD 53 (data transfer command). By using the SDIO commands, it is possible to support the variable block length transfer, and multi-block transfer, and optimize the driver. When access is made by using the commands CMD 48 and CMD 49, it is possible to access the extension register without regard to the spatial mapping of the SDIO.

More specifically, when the extension register is used in the SDIO, each page of the extension register is mapped onto each function area. In the case of the example shown in FIG. 15, page 0 of the extension register is mapped onto the function 0 of the function area 61, page 1 and page 2 are mapped onto the function 1, and page 3 is mapped onto the function 2. The function 0 holds address information indicating positions on the SDIO map at which function registers of the pages are arranged. Accordingly, by using the address information, it is possible to access each page of the extension register by means of not only the driver using the commands CMD 48 and CMD 49, but also the driver using the commands CMD 52 and CMD 53.

It should be noted that the host 20 delivers position information about the extension register assigned to the extended function to the driver from the general information field described in the first page of the extension register. Thereby, it becomes possible to control the extended function even when the extended function is arranged at an arbitrary position.

Further, in the state where data transfer is enabled between the host 20 and memory device 11 by the plug-and-play, it becomes possible to carry out data transfer between the host 20 and SDIO serving as an extended function section by using the commands CMD 48, CMD 49, CMD 52, and CMD 53.

According to the above embodiment, the extension register including a plurality of pages is provided in the RAM 15 of the memory device 11, and the standard general information field configured to recognize a specific driver is set in page 0 of the extension register 31. Accordingly, the host 20 sets a driver by referring to the general information field in page 0 of the extension register 31, whereby plug-and-play can be realized.

Further, by defining the commands CMD 48 and CMD 49 exclusively used to access the extension register, the host controller for the memory can also efficiently control the added function.

Moreover, the data transfer is made transfer of the 512-byte fixed block length, and hence the dedicated command configured to access the extension register can be issued from the conventional host controller for the memory.

Furthermore, information about the effective data length or a masking function at the time of write is set as an argument of the command, and hence when part of the data is to be rewritten, the read-modify-write operation is not necessary, and part of the data can easily be rewritten.

Further, the host controller compatible with the SDIO card supports the data port, and hence it becomes possible to carry out data transfer to a certain specific device, and realize implementation that enables reduction in the amount of the extension register space consumed.

Further, by using the data port, it is possible to support a burst transfer command based on a plurality of blocks in the SDIO, and efficiently carry out data transfer of a device other than the memory. (Although not described in this embodiment, in the memory too, when a burst transfer command based on a plurality of blocks is defined, transfer of a plurality of blocks is enabled.)

Furthermore, it becomes possible for the host controller compatible with the SDIO card to be compatible with short-length-block transfer, and multi-block transfer by accessing the extension register by using an access command of the SDIO. Accordingly, it becomes possible to create a further optimized driver.

Further, it is made possible for the card vendor to assign a register configured to control an additional function to an arbitrary position on the extension register, and thus the card vendor provides address information about the implemented register from the general information field in page 0. Accordingly, it is possible to arrange the defined function registers in a relocatable manner. Accordingly, the work of determining address assignment conventionally requiring standardization is made unnecessary, and it is possible to facilitate manufacture of the device.

It should be noted that the configuration of the extension register is not limited to a plurality of pages, and it is also possible to make the extension register constituted of one page, and set areas corresponding to page 0, and pages 1 to 7 within the one page.

(Determination of Usable Functions by Revision Confirmation)

Each of the functions described above is provided with a register configured to indicate revision on the extension register set defined by the function. Further, the function driver knows the corresponding revision by itself. When a certain function is to be extended by revision improvement, it is possible to maintain the compatibility by extending the function while maintaining compatibility with the conventional function. When a removable card is used, usable functions are determined by the combination of the function revision of the card, and revision of the function driver installed in the host system.

FIG. 16 shows an example of revision management. FIG. 16 shows examples of the function available in accordance with the revision of each of the card and function driver. For example, the case where there are three revisions (A<B<C) will be described. In this case, extension in which C includes the function of B, and B includes the function of A is carried out. Revision management is carried out by the function driver. The function driver itself knows its own revision. Available functions are determined on the basis of the combinations shown in FIG. 16. In all the function driver revisions, the function of the revision A can be used and, in order to use the function of the revision B, it is necessary for the function driver revision to be higher than or equal to B.

(Second Embodiment)

Figure 17:
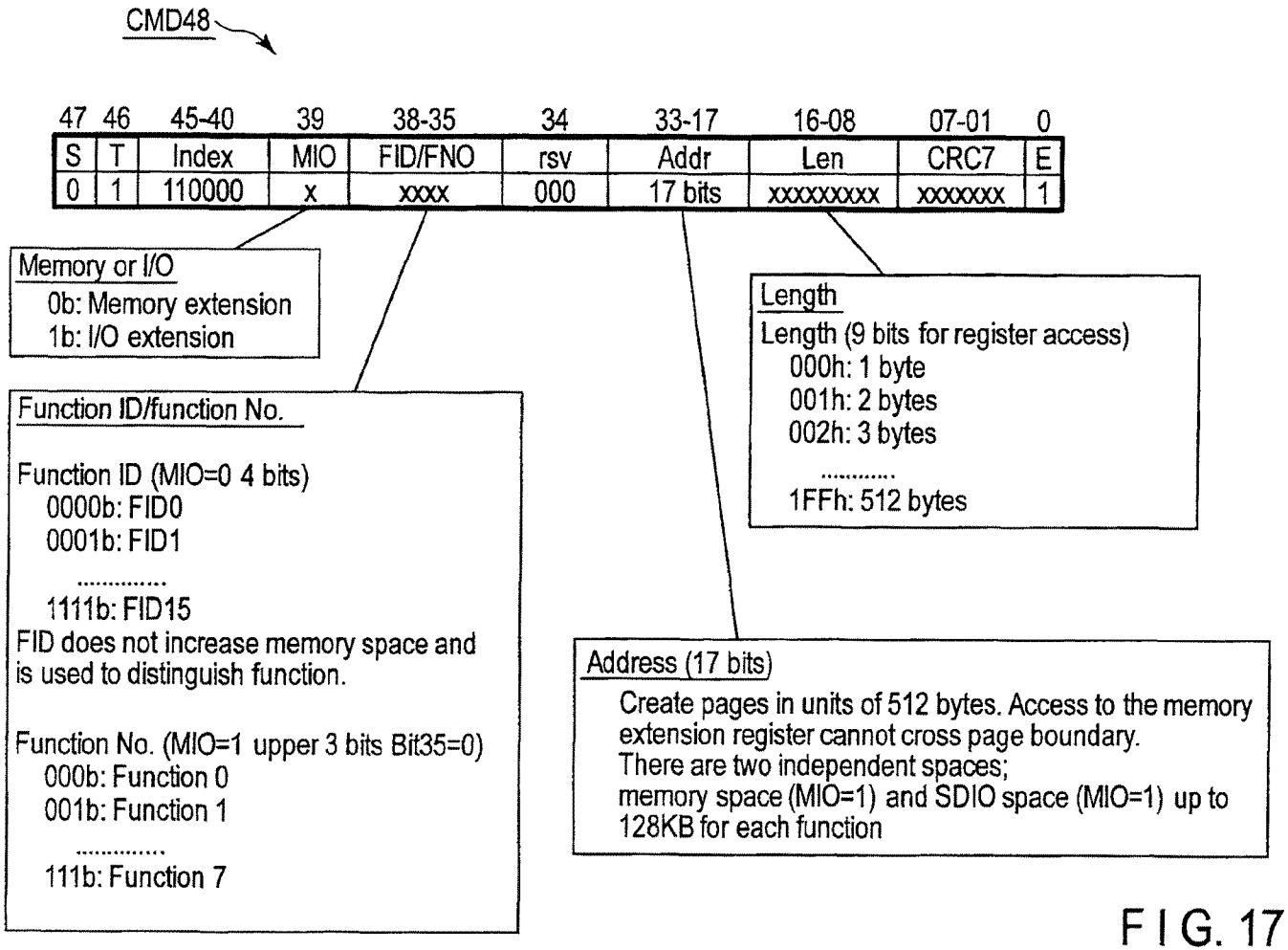
FIG. 17 is a view showing an example of a read command of an extension register according to a second embodiment.
Figure 18:
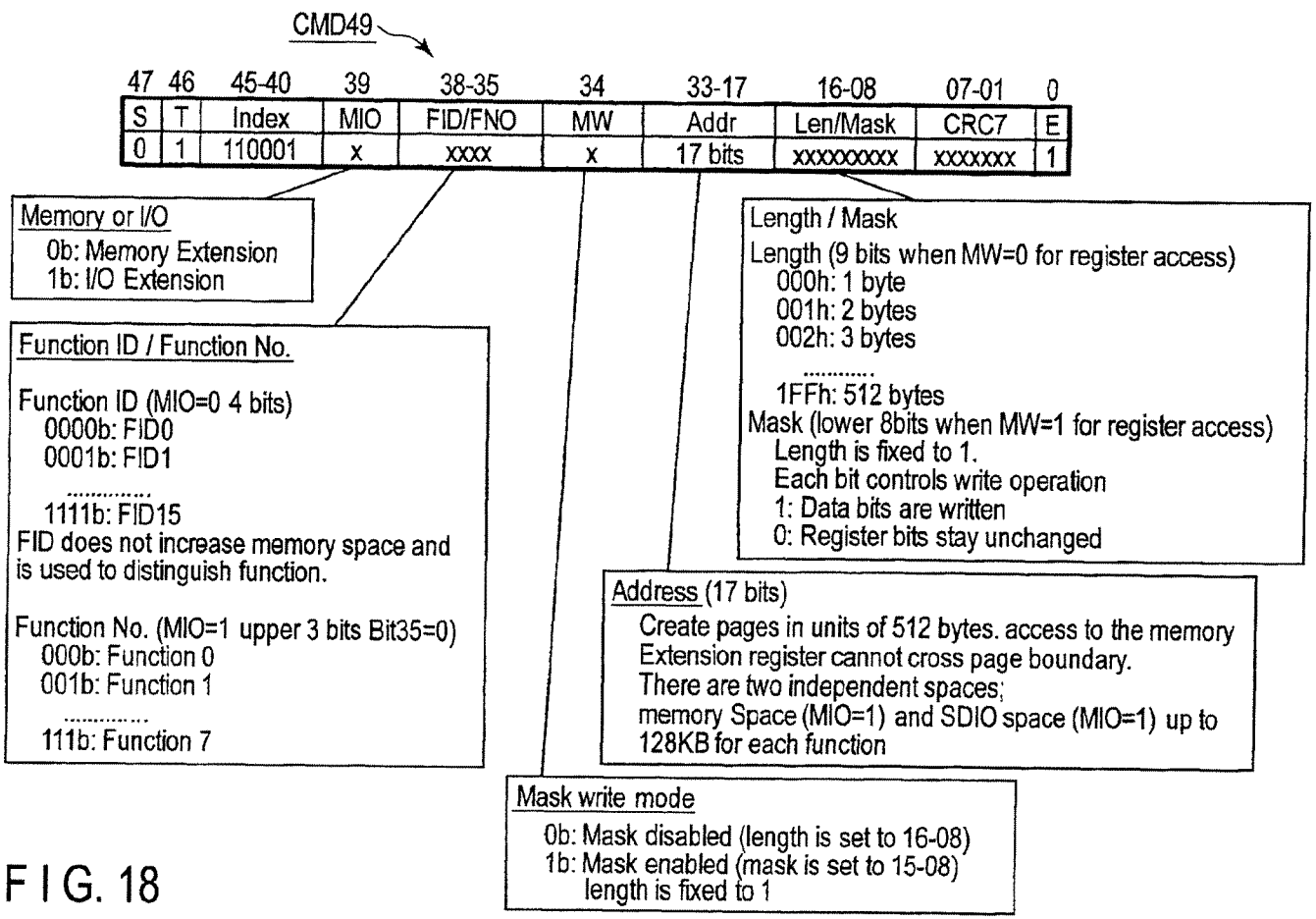
FIG. 18 is a view showing an example of a write command of an extension register according to the second embodiment.

FIG. 17 and FIG. 18 each show an example of the field configuration of a read command CMD 48, and write command CMD 49 according to a second embodiment. It should be noted that in FIG. 17, and FIG. 18, parts identical to FIG. 3, and FIG. 6 are denoted by identical reference symbols, and a description of them is omitted.

The commands CMD 48 and CMD 49 shown in FIG. 17 and FIG. 18 are the commands CMD 48 and CMD 49 shown in FIG. 3 and FIG. 6 in each of which the address field constituted of 12 bits of "RS" and "OFS" is extended to 20 bits constituted of "FNO" and "Addr" to thereby consider the affinity/compatibility to/with the SDIO.

The "MIO" field is a bit separating the memory space and SDIO space from each other, thereby enabling both the spaces to define an extension register independently of each other. Accordingly, when the extension register is defined, it is possible to prevent both the spaces from interfering with each other. When "MIO" is 0 ("MIO"=0), the extension register for the memory can be accessed and, when "MIO" is 1 ("MIO"=1), extension register for the SDIO can be accessed.

The "FNO/FID" field is set to one of "FNO" and "FID" according to the value of the "MIO" field. When "MIO" is 1 ("MIO"=1), "FNO" is a 3-bit field indicating a function number and, when "MIO" is 0 ("MIO"=0), "FID" is a 4-bit field indicating function identification information. Due to the different bit numbers, different symbols are used for expression. When the aforementioned general information field is to be read, "FNO/FID" is set to 0 ("FNO/FID"=0). It is sufficient if the host driver sets this field to 0. Although "FID" is not used in the memory space, "FNO" is used in the SDIO space to distinguish the eight function spaces.

That is, regarding "FNO/FID" (4 bits), when "MIO" is 1 ("MIO"=1), the bits 38 to 36 indicate "FNO", and bit 35 is always made "0".

Further, regarding "FNO/FID", when "MIO" is 0 ("MIO"=0), the bits 38 to 36 indicate "FID". "FID" is used to distinguish the functions without increasing the memory space.

(The Memory Space May be Increased by Using "FID", this being not Limited.)

When a function is to be implemented in a card, a unique value is assigned to "FID/FNO", and is indicated in the field definition of general information as will be described later. Accordingly, when a command is issued to the data port, the function driver sets "FID/FNO" as an argument, whereby it is possible for the card to confirm that the command is a command corresponding to the designated function. Accordingly, it is possible to prevent data corruption and malfunction due to designation of a wrong data port, and erroneous write from occurring, thereby assuring safety.

Although when the host attempts to specify a function from address information, the host must decode the address information, function distinction is enabled by using only "FID/FNO", and control of the host driver can be simplified. That is, the same command is used by a plurality of functions in a mixing manner, and hence in the host and card, "FID/FNO" is set so that the functions can be distinguished.

The "Addr" field (17 bits) is an address, and can access a space of 128 KB. The upper 8 bits of "Addr" are used as a page number. One of pages 0 to 7 is selected by the 8 bits. A 512-byte block in the selected page is accessed by the lower 9 bits. That is, by using "MIO", "FNO" ("MIO"=1), and "Addr", a position of the extension register is designated.

The "Len" field (8 bits) shown in FIG. 17 indicates an effective data length.

Further, in the write command (CMD 49) shown in FIG. 18, "MW" is a bit used to designate the mask write mode.

When "MW" is 0 ("MW"=0), the mask is disabled and, when "MW" is 1 ("MW"=1), the mask is enabled.

Further, in the "Len/Mask" field, when the mask is disabled ("MW"=0), the data length is set to 9 bits (16 to 08). Further, when the mask is enabled ("MW"=1), the data length is set to 1, and the write operation is controlled as described above by the lower 8 bits of the 9 bits (16 to 08). That is, when each bit in the 8 bits is "1", data of the register is written and, when each bit is "0", the bit in the register is not changed, and the value set already is maintained.

In the second embodiment, it is possible to make the space which can be accessed by the SDIO commands CMD 52 and CMD 53, and SDIO space which can be accessed by the commands CMD 48 and CMD 49 coincide with each other. That is, it becomes possible to access the same extension register set by using either commands.

(Read Command of Extension Register, First Operation Mode)

Figure 19:
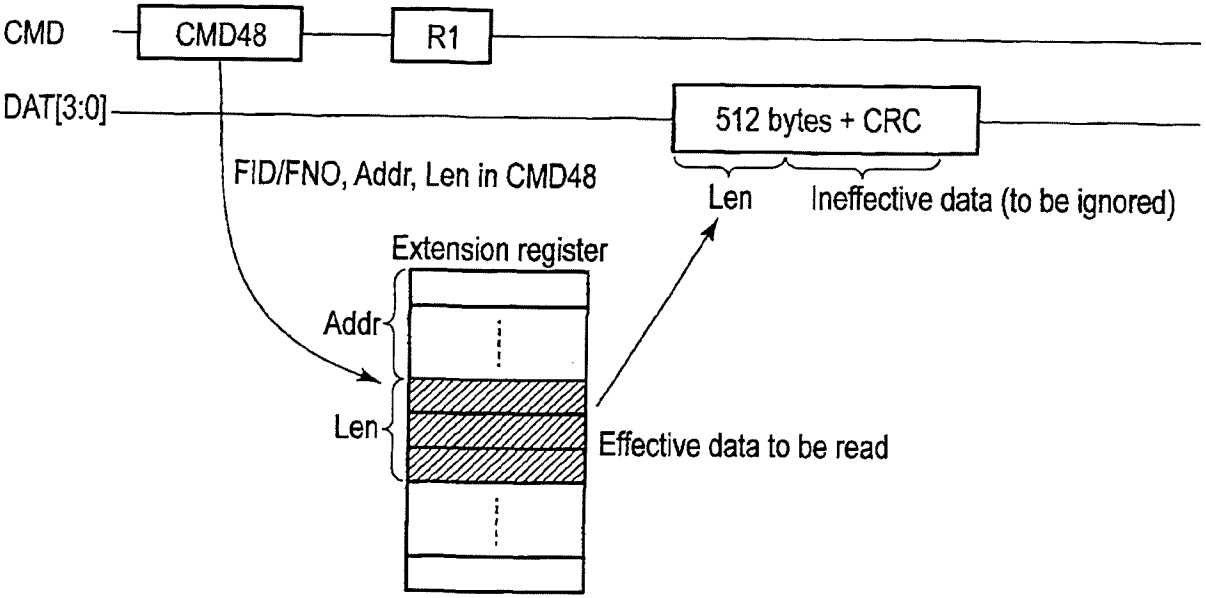
FIG. 19 is a timing chart showing a read operation of an extension register to be carried out by a read command.

FIG. 19 shows an example of a read operation of the extension register to be carried out in a first operation mode of a read command (CMD 48) of the extension register.

As shown in FIG. 19, upon receipt of a command (CMD 48) from the host 20, the memory device 11 returns a response (R1) to the host 20 and, thereafter reads a 512-byte data block from the extension register 31.

More specifically, a position of data in the page to be read is designated by "FNO" (MIO=1) and "Addr", and effective data length to be read is designated by "Len". In this way, the data in the designated extension register is set to the head of the 512-byte data block, and is then read. Of the 512-byte data block, data exceeding the data length designated by "Len" becomes ineffective data. A CRC code is added to the end of the data block, thereby making it possible to check whether or not the data has been properly received (checking of data is carried out by including ineffective data).

Figure 20:
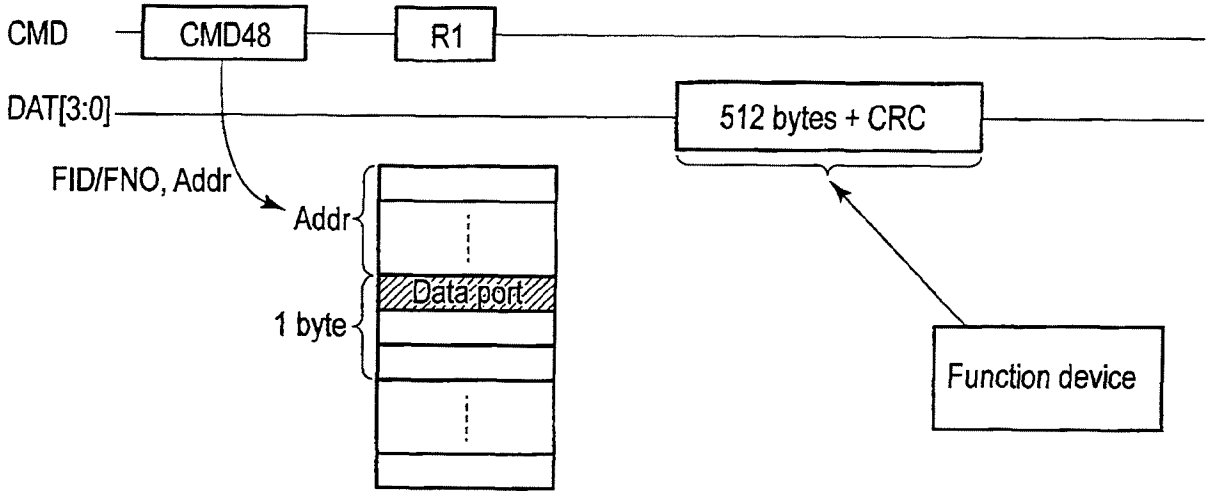
FIG. 20 is a timing chart showing a read operation of a data port to be carried out by a read command.

FIG. 20 shows an example of a read operation of a data port to be carried out in the second operation mode.

Upon receipt of the command (CMD 48), the memory device 11 returns a response (R1) and, thereafter returns the 512-byte data block.

The memory device 11 verifies whether or not the argument "FID/FNO" of the command coincides with the assigned extension register set. The extension register set is specified by "FNO" ("MIO"=1) and "Addr". When "FID/FNO" and the extension register set coincide with each other, a position in the selected page of the extension register is designated by the argument "Addr" of the command. It is sufficient if the data port occupies only an address of one byte on the extension register map. It is sufficient if it is distinguished whether or not an address is a data port by decoding of the address, and it is not necessary for the data to be actually transmitted through the 1-byte width port, and hence the data transmission performance is not adversely affected. It is possible to read data of one block (512-byte unit) from the device assigned to this data port. That is, it is possible to read data of one block (512-byte unit) at one time. The read data is held in, for example, the buffer 16, and is then read by the host 20.

When the same data port is subsequently read, the subsequent 512-byte data can be read. The place from which data to be read from the data port is taken can be freely defined by the specification of the extended function. Regarding data port control, the control can be carried out by defining a control register on, for example, the extension register. A CRC code is added to the last part of the 512-byte data block to make it possible to check whether or not the data has been properly received.

Further, as a result of the above verification, when "FID/FNO" is not coincident with the value assigned to the function, the data transfer operation is not executed, and the data block is not transferred.

(Write Command of Extension Register, First Operation Mode)

Figure 21:
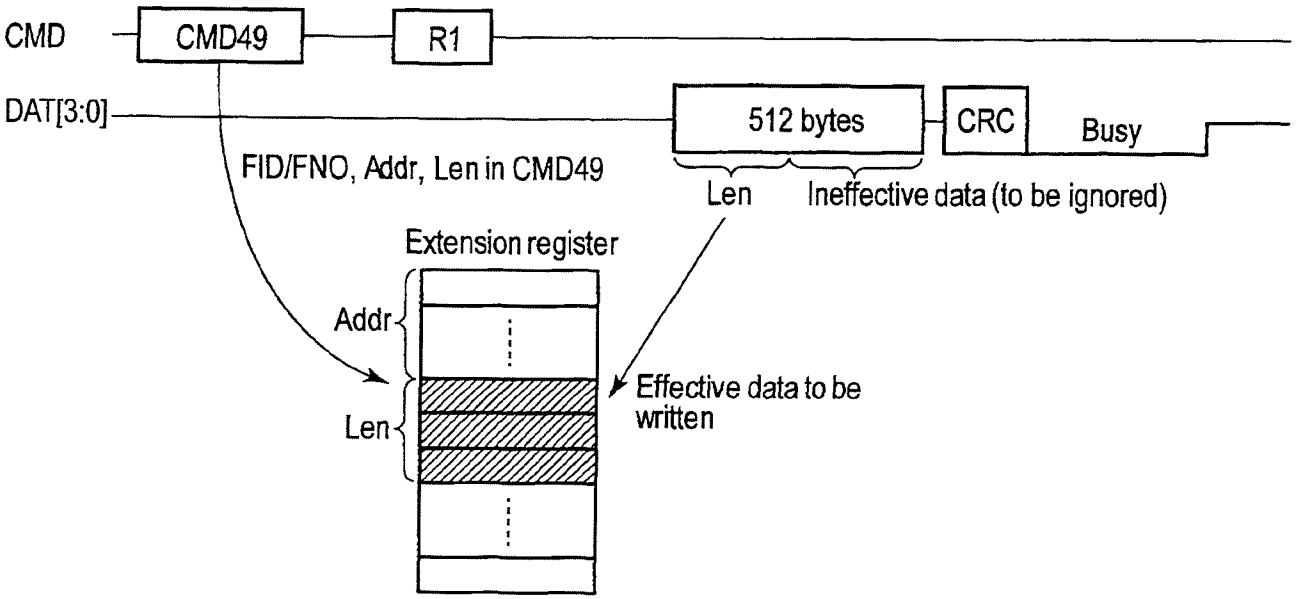
FIG. 21 is a timing chart showing a write operation of an extension register to be carried out by a write command.

FIG. 21 shows an example of a write command of the extension register.

Upon receipt of the command (CMD 49), the memory device 11 returns a response (R1) and, thereafter receives a 512-byte data block.

The memory device 11 returns a CRC code indicating whether or not the data block has properly been received to the host 20. Thereafter, the memory device 11 returns information indicating the busy state until the processing of the command is completed, and notifies the host 20 of the timing at which the host 20 can issue the next command. The data block is held in the buffer 16.

In the write command (CMD 49), parts identical to the read command (CMD 48) are denoted by identical reference symbols. The write command, and read command are distinguished from each other by "Index". A page in the extension register, and a position of data in the selected page are designated by "FNO" ("MIO"=1), and "Addr" of 17 bits. Furthermore, a data length to be written to the 512-byte extension register is designated by the 9-bit "Len" field. Accordingly, it is possible to write data having an arbitrary data length (byte unit) within 512 bytes to an arbitrary page and position in the extension register.

As described above, in the write command (CMD 49), a mask register is provided in the argument of the command. That is, "Mask" indicates an 8-bit length mask register. By the mask register, it becomes possible to carry out an operation in units of one bit in data write of one byte, and write data to only a specific bit. Accordingly, in a bit operation within one byte, it is not necessary to carry out the read-modify-write operation. When the data length is one byte, i.e., when the upper 1 bit of "Mask" is "1", the mask register becomes effective.

(Write Command of Extension Register, Second Operation Mode)

Figure 22:
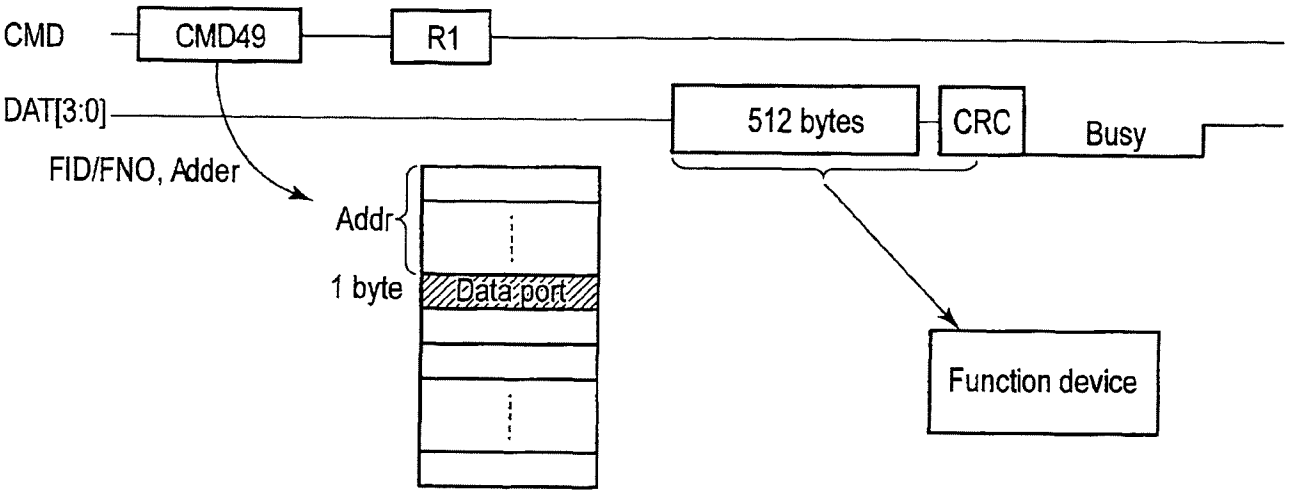
FIG. 22 is a timing chart showing a write operation of a data port to be carried out by a write command.

FIG. 22 shows an example of an operation of a write data port to be carried out in the second operation mode. Upon receipt of the command (CMD 49), the memory device 11 returns a response (R1). Thereafter, the memory device 11 verifies whether or not the argument "FID/FNO" of the command coincides with the extension register set. The extension register set is specified by "FNO" ("MIO"=1) and "Addr". When "FID/FNO" and the extension register set coincide with each other, a position in the selected page of the extension register is designated by the argument "Addr" of the command, and the 512-byte data block is received.

Subsequently, the memory device 11 returns a CRC code indicating whether or not the data block has properly been received to the host. Thereafter, the memory device 11 returns information indicating the busy state until the processing of the command is completed, and notifies the host 20 of the timing at which the host 20 can issue the next command. The data block is held in the buffer 16.

In the command processing, a page and position in the extension register are designated, and a data port is designated by the argument "Addr" of the command. It is sufficient if the data port occupies only an address of one byte on the extension register map. It is possible to write data of one block (512-byte unit) held in the buffer 16 to a certain device assigned to this data port. That is, it is possible to write data of one block at one time.

When the same data port is subsequently written, the subsequent 512-byte data can be written to the device to which the data is assigned. The place to which the data of the data port is delivered can be freely defined by the specification of the extended function. Regarding data port control, the control can be carried out by defining a control register on, for example, the extension register.

Further, as a result of the above verification, when "FID/FNO" is not coincident with the value assigned to the function, the data transfer operation is not executed, and the data block is discarded.

(Usage Example of General Information Field)

FIG. 23 is a view showing an example associated with designation of FID according to the second embodiment. The meaning of the general information field is identical to FIG. 10. The point different from FIG. 10 is that a 4-bit field is secured in order to set the value of "FID/FNO" in the format of the extension address, and length field. Unique "FID/FNO" is set for each function. Each function implemented in the card knows its own "FID/FNO".

(Operation of Read Command (CMD 48))

Figure 24:
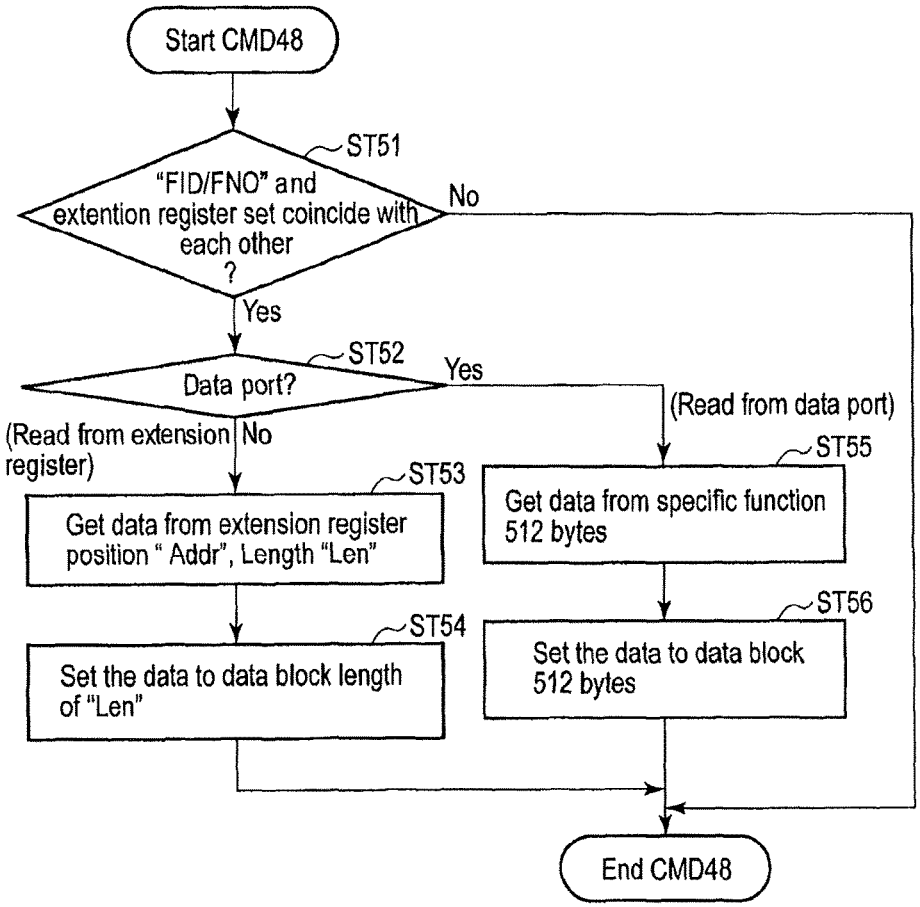
FIG. 24 is a flowchart showing an example of an operation of a memory system conforming to a read command according to the second embodiment.

FIG. 24 shows an operation of a controller 11a in the memory device 11 corresponding to the read command (CMD 48) shown in FIG. 19 and FIG. 20.

When the read command is received, it is verified by the CPU 13 whether or not the argument "FID/FNO" of the command coincides with the assigned extension register set (ST51). The extension register set is specified by "FNO" ("MIO"=1) and "Addr". As a result of the verification, when both of them coincide with each other, the argument "Addr" of the command is analyzed, and it is determined whether or not the read command is read from the data port (ST52). That is, it is determined whether or not the address is an address defined by "FNO" ("MIO"=1) and "Addr" as the data port.

As a result, when it is determined that the address is not the address of the data port, and the command is read of the extension register, data of the data length "Len" is acquired from the selected page of the extension register 31 on the basis of the position "Addr" in the first operation mode (ST53). The acquired data of the data length "Len" is set to the 512-byte data block of the buffer 16 (ST54).

On the other hand, when it is determined in step ST52 that the read command is read from the data port, data of 512 bytes is acquired from, for example, a specific function of the SDIO 19 through a data port of a position set in advance in the selected page of the extension register in the second operation mode (ST55). The acquired data is set to the 512-byte data block of the buffer 16 (ST56).

As a result of the determination of step ST51 described above, when the command is not a command associated with the data port, the processing is terminated.

(Operation of Write Command (CMD 49))

Figure 25:
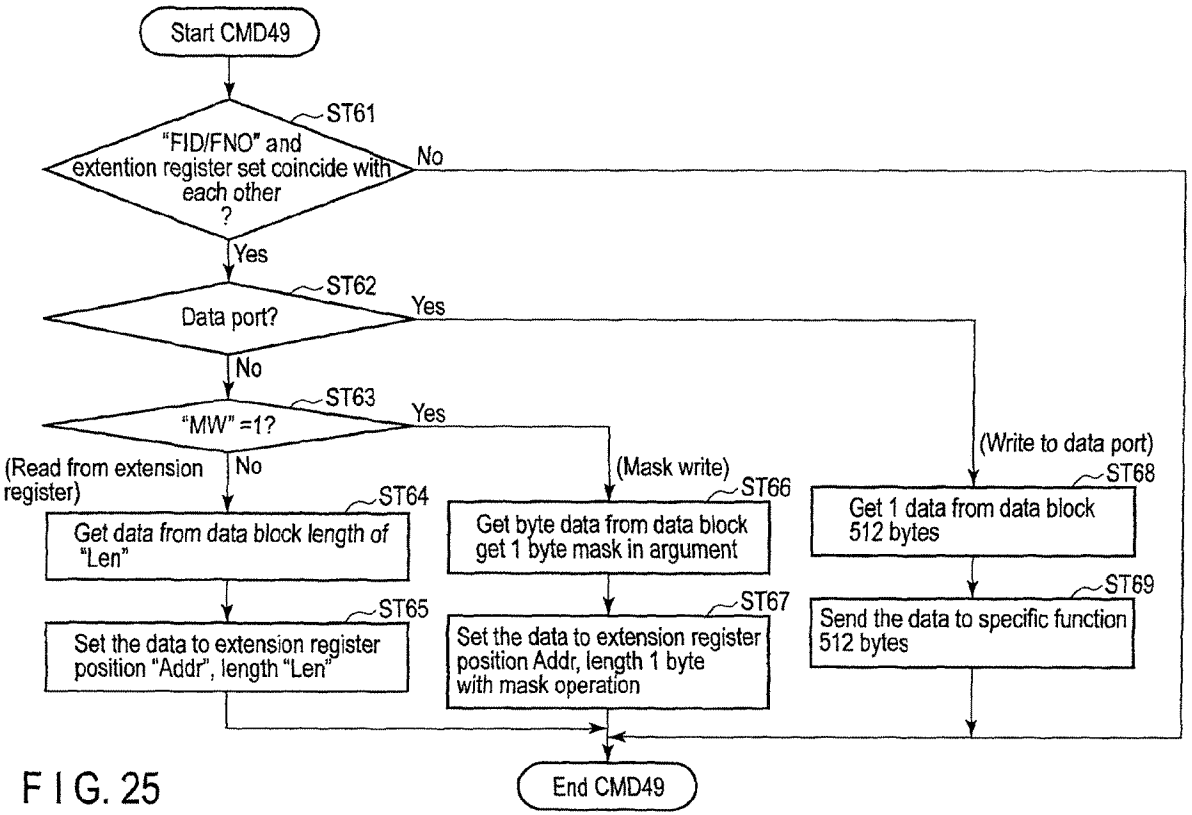
FIG. 25 is a flowchart showing an example of an operation of a memory system conforming to a write command according to the second embodiment.

FIG. 25 shows an operation of a controller in the memory device 11 corresponding to the write command (CMD 49).

When the write command is received, it is verified by the CPU 13 (command processing section 14a) whether or not the argument "FID/FNO" of the command coincides with the assigned extension register set (ST61). The extension register set is specified by "FNO" ("MIO"=1) and "Addr". As a result of the verification, when both of them coincide with each other, the argument "Addr" of the command is analyzed, and it is determined whether or not the write command is write to the data port (ST62). That is, it is determined whether or not the position is a position of the data port set in advance by "FNO" ("MIO"=1) and "Addr".

As a result of the above determination, when it is determined that the write command is write to a part other than the data port, it is determined whether or not the argument "MW" of the command is "1", i.e., whether or not the write is mask write (ST63).

As a result of the determination, when it is determined that the write is not mask write, write processing of the extension register is carried out by the extension register processing section 14c. That is, data of a length designated by "Len" is acquired from the data block of the buffer 16 (ST64). The acquired data is set to a designated position in the selected page of the extension register on the basis of "Addr" (ST65).

On the other hand, when it is determined in step ST63 that "MW" is "1" ("MW"="1"), and the write is mask write, 1-byte data is acquired from the data block of the buffer 16 by the extension register processing section 14c, and 1-byte mask is acquired from the argument (ST66).

Subsequently, a mask operation shown in FIGS. 7A, 7B, and 7C is executed by using the 1-byte data, and 1-byte mask, and data obtained when the mask operation of the 1 byte is executed is set to a predetermined position in a predetermined page of the extension register designated by "Addr" (ST67).

Further, when it is determined in step ST62 that the write command is write to the data port, 512-byte data is acquired from the data block of the buffer 16 (ST68). The acquired data is sent to, for example, a specific function of the SDIO 19 through a data port of a position in a designated page of the extension register (ST69).

As a result of the determination of step ST61 described above, when the write command is not a command associated with the data port, the processing is terminated.

(CMD 58, CMD 59)

Figure 26:
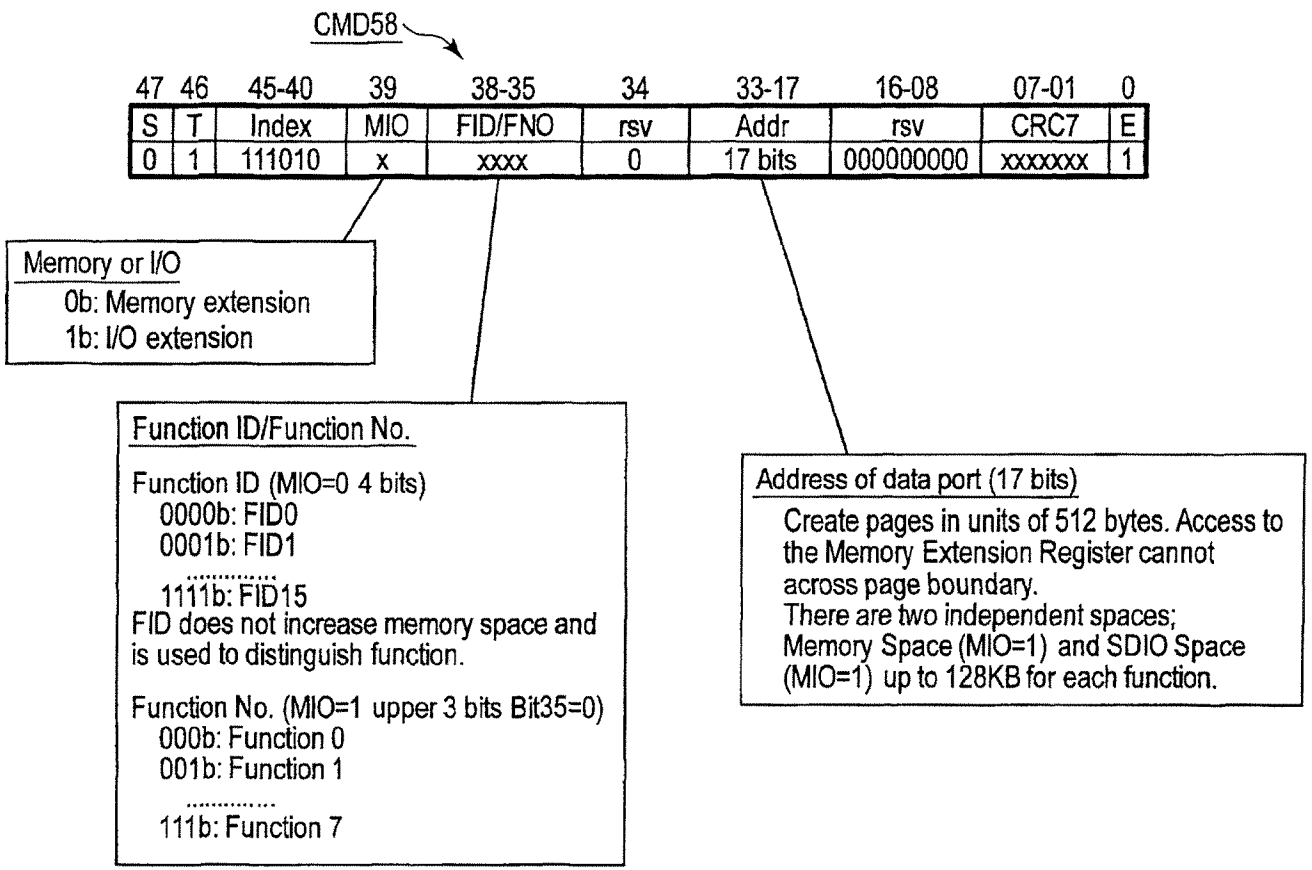
FIG. 26 is a view showing an example of a multi-block read command of an extension register according to the second embodiment.
Figure 27:
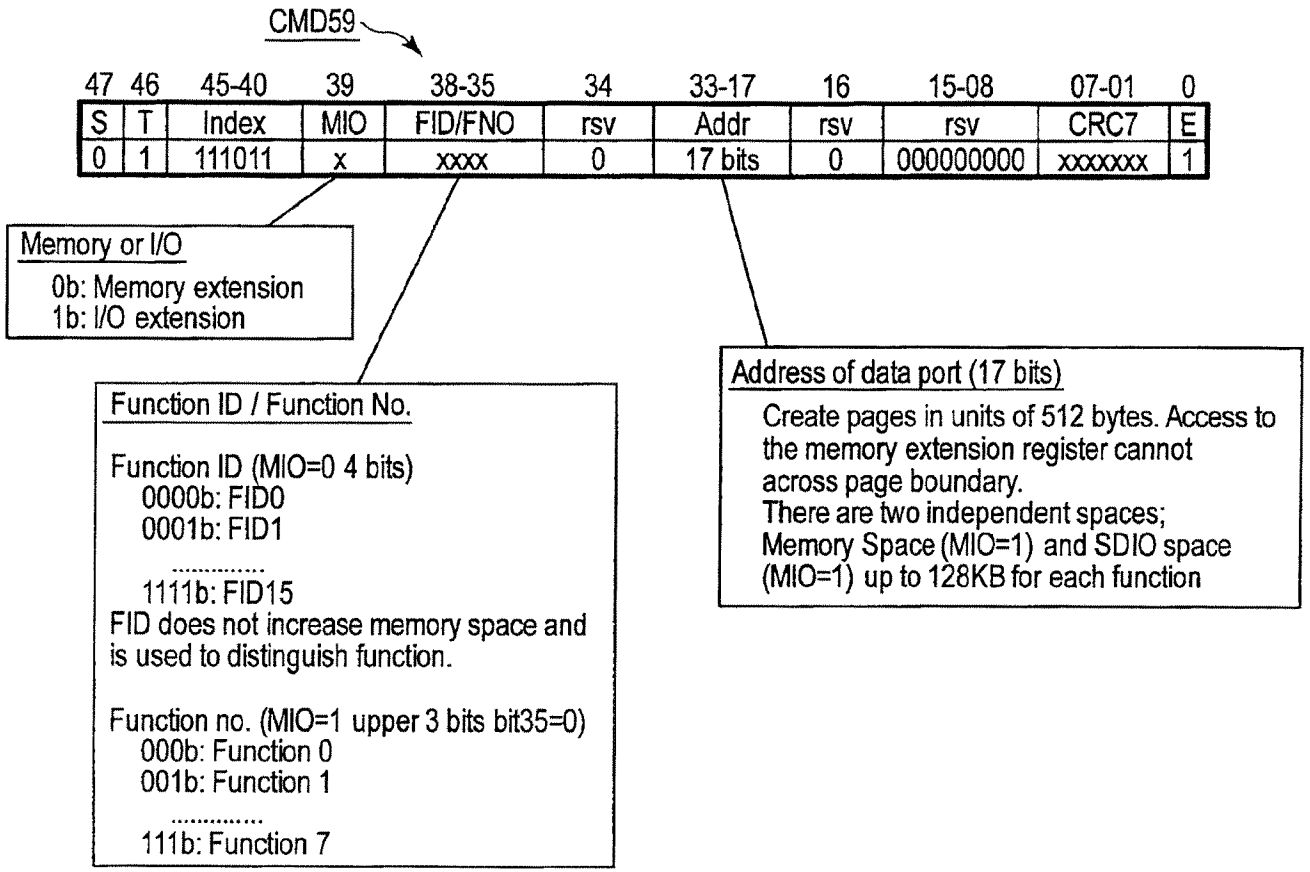
FIG. 27 is a view showing an example of a multi-block write command of an extension register according to the second embodiment.

FIG. 26 and FIG. 27 each show a multi-block transfer command configured to improve transfer efficiency of data, FIG. 26 shows multi-block read (CMD 58), and FIG. 27 shows multi-block write (CMD 59).

Although the arguments of the commands CMD 58 and CMD 59 are similar to those of the commands CMD 48 and CMD 49, they partly differ from each other in the definition. Further, the command CMD 58 has no argument "Len" of the command CMD 48, and command CMD 59 has no arguments "MW" and "Len/Mask" of the command CMD 49. This is because transfer to a data port is assumed in the multi-block transfer. The commands CMD 58 and CMD 59 are optional commands, and a data port is configured in such a manner that a plurality of single-block transfer commands CMD 48 or CMD 49 can be substituted for the command CMD 58 or CMD 59.

Data transfer through a data port is assumed in the multi-block transfer. Accordingly, this command becomes effective only when an address of this command coincides with an address defined as a data port in the extension register space. Accordingly, when this command is executed with respect to a normal extension register, an error occurs, and data transfer is not executed.

A code configured to recognize a function for which an issued command is used is set to the "FID/FNO" field (4 bits). Accordingly, by using the "FID" field, the function can be recognized by means of the value, and implementation is facilitated. The function can also be recognized by using the "Addr" (address) field. However, an address to be assigned differs depending on the card, and hence there is the problem that it is difficult for the host driver to manage recognition of a function from an address.

It is possible for the host driver to use a data buffer or the like implemented in the host system for each function for switching control.

The arguments of the command CMD 58/59 do not include the "Len" field configured to designate the data length. This is because for data transfer of long data, it is necessary to designate a long block count, and this information is too much for the argument of the read/write command to designate. Accordingly, it is necessary to designate the block count necessary for data transfer before issuing the command CMD 58/59. Accordingly, for example, a method of defining a register configured to set a block count to the extension register, and setting the register by using the command CMD 49, a method of issuing a command configured to set a block count immediately before the command CMD 58/59 is issued or the like is used.

When setting the number of blocks to the extension register, "FID/FNO" of CMD 49 which sets it up, and "FID/FNO" of CMD 58/59 which executes data transfer need to be in coincidence. The data transfer is not performed when both of these are not in coincidence.

When data is set to the extension register, the data can independently be set for each function, and each function is not affected by other functions. When a common block count command is used, setting of a block count to the memory multi-block command, and distinction thereof are required. Accordingly, it is necessary to issue the command immediately before issuing each command CMD 58/59, and it is necessary for the host driver to massage the issuing order in such a manner that other commands are not issued immediately after issuance of the command.

In order that the host may specify a function of a multi-function card/device, a relative card address (RCA) obtained by initialization, device ID, aforementioned "MIO" information, and "FNO/FID" information are needed.

Figure 28B:
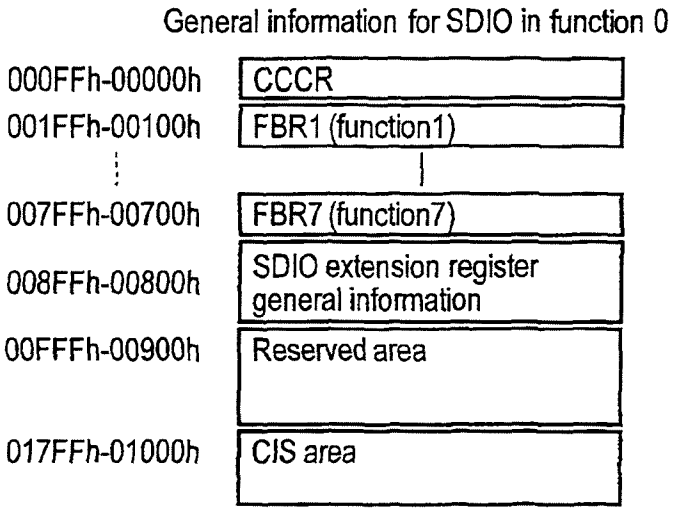
FIGS. 28A and 28B are views showing an example of a display position of general information according to the second embodiment.
Figure 28A:
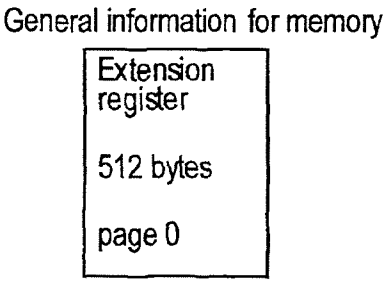

Each of FIGS. 28A and 28B shows example of a display position of a general information field according to the second embodiment. In the memory space shown in FIG. 28A, the general information field is arranged in page 0 of the extension register and, in the SDIO space shown in FIG. 28B, the general information field is arranged at a specific position at which the field does not conflict with the conventional register. In FIG. 28B, for example, the general information for SDIO is arranged at "008FFh"-"00800h" (512 bytes) ("h" indicates a hexadecimal number).

Figure 29:
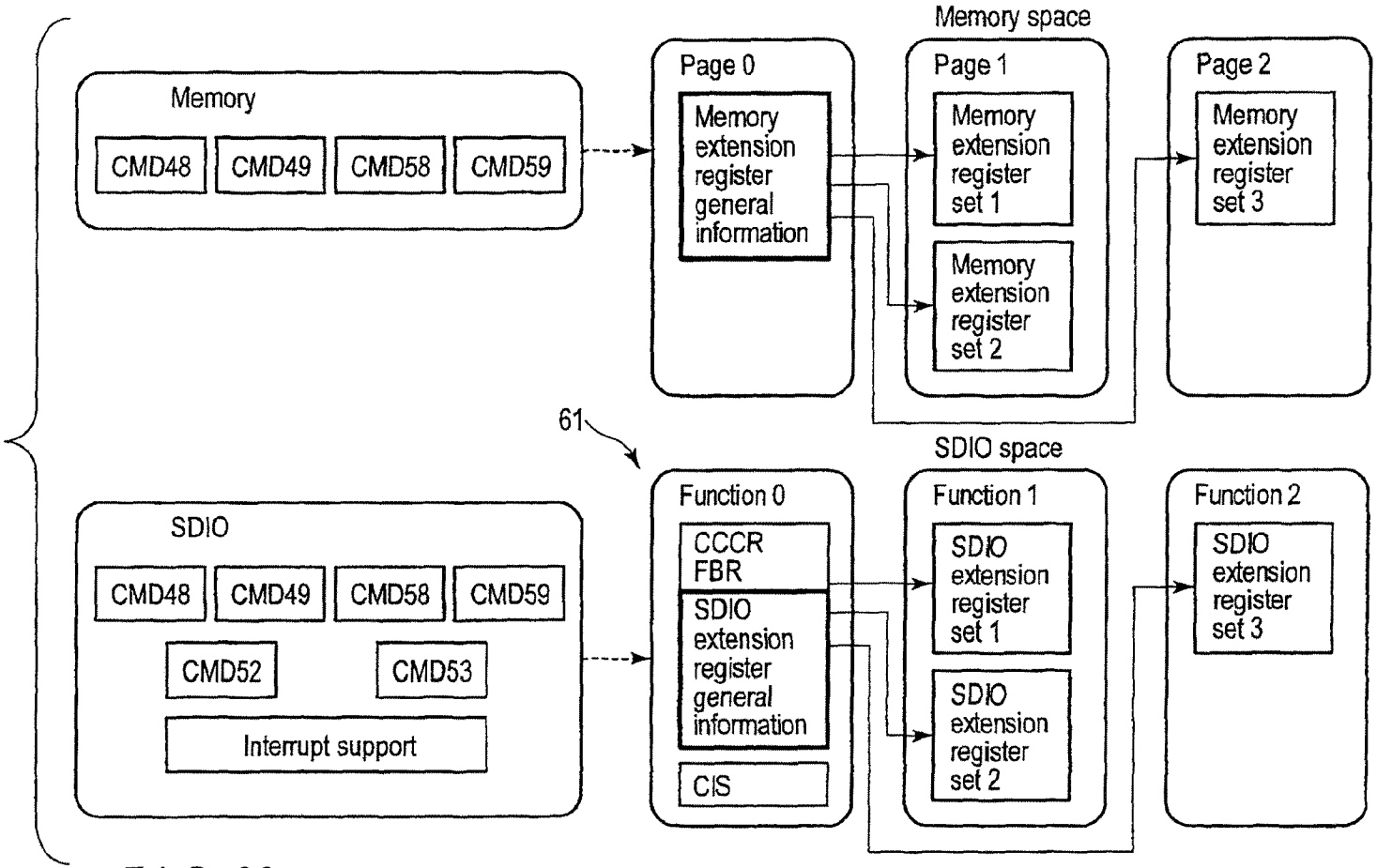
FIG. 29 is a view showing an example of a relationship between the memory space and SDIO space according to the second embodiment.

FIG. 29 shows an example of the correspondence between the memory space and SDIO space according to the second embodiment. In FIG. 29, parts identical to FIG. 15 are denoted by identical reference symbols.

The memory extension register can be accessed by using the command CMD 48/49. More specifically, single-block transfer is carried out by using a fixed-block length of 512 bytes. Furthermore, in the case of the data port, it is possible to carry out multi-block transfer by using the command CMD 58/59. The SDIO extension register can be accessed not only by the command CMD 48/49 but also by the command CMD 52/53. The command CMD 53 is a variable-length command, and hence can be used for access to the SDIO extension register irrespective of the data port.

(Installation of Function Driver)

Whether or not the SDIO function (CMD 52/53) can be used is determined by the function supported by the host system. A host that does not support the SDIO installs a function driver using the commands CMD 48/49 and CMD 58/59. A host system that supports the SDIO can further install a function driver using the command CMD 52/53.

It should be noted that the command CMD 53 is a command which supports, for example, variable-length block transfer and multi-block transfer, and can be read or written, and command CMD 52 is a command which has, for example, no data, and enables read or write of 1-byte data by argument and response.

The SDIO extension register space of the command CMD 48/49 is equivalent to the space of the command CMD 52/53. The command CMD 53 supports variable-length block transfer and multi-block transfer, and hence by using an optimized SDIO driver, data transfer is executed more efficiently.

Like a host supporting the command CMD 48/49 refers to the information without referring to the card information structure (CIS), the general information of the SDIO can be seen from a specific position of the function 0.

(Selection of Function Driver)

Regarding an SDIO-compatible card, when a function driver using the command CMD 52/53 is installed, the function driver is used and, when the function driver is not installed, a function driver using the commands CMD 48/49, and CMD 58/59 is used.

Regarding an SDIO-incompatible card, a function driver using the commands CMD 48/49, and CMD 58/59 is used.

(Initialization Operation of SDIO)

Figure 30:
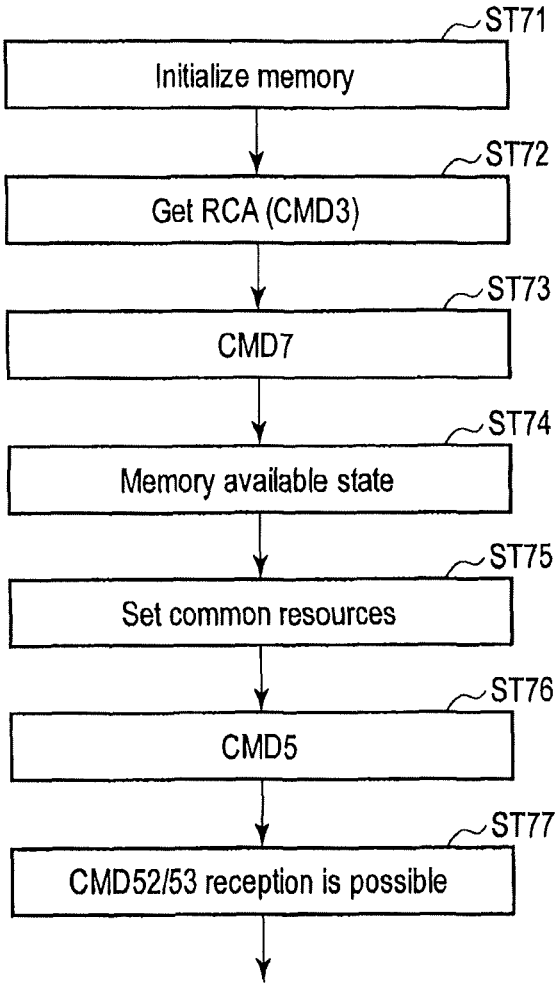
FIG. 30 is a flowchart shown to explain simplification of initialization of the SDIO according to the second embodiment.

FIG. 30 schematically shows a second initialization operation of the SDIO in a combo card.

Heretofore, the definition of the initialization sequence (a first initialization operation) of the SDIO is given in such a manner that the SDIO function is not enabled unless an SDIO initialization command (CMD 5) is firstly executed. Accordingly, even when a memory is used in the combo card, re-initialization is required when the SDIO is to be used, thereby making it hard for the host to use the specification.

Normally, it is desirable that an I/O function be initialized immediately before the function is used in order not to waste the system resources or not to waste the power. Regarding the timing for initialization of the function, it is recommendable to carry out the initialization at a point of time at which the application using the function is activated.

Further, in the re-initialization, changes in the relative card address (RCA) are made, and hence the accessing method of the memory is affected. In order to enable the SDIO function without affecting memory control, it is desirable that the memory initialization sequence be made the fundamental, and the SDIO function be made addable later.

Thus, as shown in FIG. 30, when the memory device 11 is activated and initialized (ST71), a command (CMD 3) is issued, and relative card address (RCA) is acquired (ST72). After this, a command (CMD 7) is issued (ST73), and the memory device 11 is set to a transfer state, i.e., a state where the memory can be used (ST74). Then, a common resource of cards, such as a pass mode and a power consumption setup, is set up (ST75). In this state, an initialization command (CMD 5) of the SDIO is issued (ST76). Thereby, the SDIO is initialized, and reception of the commands CMD 52 and CMD 53 is enabled (ST77).

In step ST76, it is also possible to set up a common resource of the SDIO automatically. Conventionally, a memory and I/O had the independent setting method in order to control a common resource. For this reason, drivers contained in a memory and I/O needed to be adjusted similarly. In the second initialization operation, a card which received CMD5 copies the common resource of the memory set up in ST75 to I/O. Therefore, it is not necessary to adjust each driver. The common resource contains a bus speed mode, RCA, current limit/power Limit, and a setup of drive capability, etc., for example.

This is an addition to the initialization method, and initialization can also be carried out by the conventional SDIO initialization sequence, and the conventional sequence has compatibility.

According to the above-mentioned configuration, the function is initialized at the timing at which the application using the function is activated, and hence it is possible to initialize each function without affecting the memory control.

(Function Driver Interface)

Heretofore, the SDIO has been controlled by assigning necessary control bits to the common register. In order for a card to control by setting a value to a register, the card needs to implement a processing function. When carrying out specific processing, by calling a functional driver, it becomes possible to process by a function driver instead of processing inside a card. More specifically, the process is performed by a host.

When the control which has conventionally been carried out by the card through the common register is defined as an application program interface (API) of the function driver, it is possible to form the control into software. By standardizing the API level, implementation of the card can be facilitated.

Examples of the API are shown below.

(1) Initialize Function

Calling a function from the host driver to initial the function (2) Abort/Reset Function Abort or reset of a function (3) Get Function Information Read of function revision Read of function information (support information or the like)

Read of interrupt information (polling)

(4) Power Consumption Control

Power mode information implemented in the function (5) Power Off Notification

Notifying the timing at which power shutdown is allowed (6) Application Interface Control interface with the application Particularly, in a card in which a plurality of functions are implemented, when the power of the card is turned off, it is necessary for the host to turn off the power after each function is brought into a state where each function allows power shutdown. Power Off Notification is an API used for this control.

Figure 31:
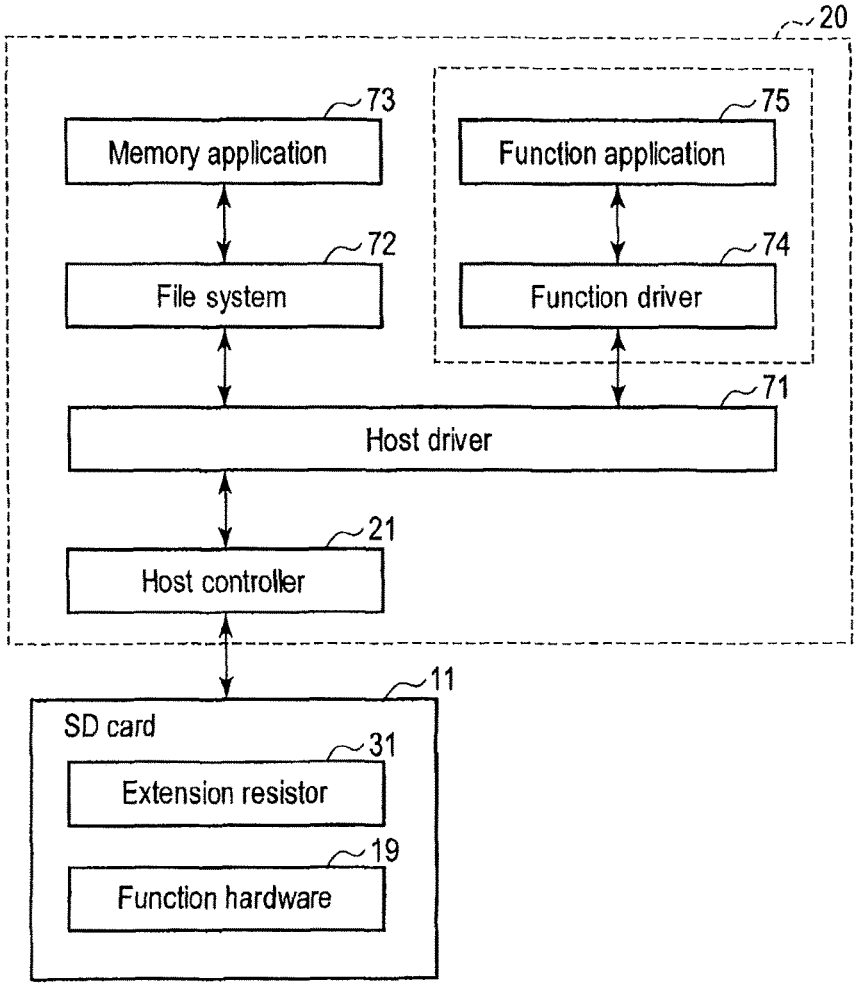
FIG. 31 is a view schematically showing a relationship between a memory device and functional interface of a host according to the second embodiment.

FIG. 31 schematically shows a relationship between an SD card serving as the memory device 11, and function interface of the host 20.

The host 20 is constituted of a host controller 21, host driver 71, file system 72, memory application 73, function driver 74, and function application 75. Further, the SD card serving as the memory device 11 includes an extension register 31, and function hardware 19 constituted of, for example, the SDIO.

In the host 20, the host driver 71 supports a function of detecting and loading the function driver 74. That is, the host driver 71 refers to the general information field of the extension register to detect the function driver 74, and executes the function driver, whereby the host driver 71 can use the extended function. Further, the function driver 74 configured to control the extension register 31, and function application 75 communicate with each other by means of an API defined by the functional specification.

The SD card includes the aforementioned general information field for the purpose of standardization so that the extension register 31 defined by the functional specification, and host driver 71 can find and load the function driver 74.

The host controller 21, and memory device 11 communicate with each other by using the aforementioned command CMD 48/49 or the like.

According to the configuration described above, by defining the control which has conventionally been carried out in the card as the API of the function driver, it is possible to form the control into software. Further, by standardizing the API level, implementation of the card can be facilitated.

Further, the host driver 71 refers to the general information field of the extension register to detect the function driver 74, and execute the function driver, whereby the host driver 71 can use the extended function. Accordingly, the host 20 can easily use the extended function.

(Control of Data Buffer by "FID")

It is possible for the memory device 11 to determine for which function a command is intended by recognizing address information. However, the address range differs depending on the function, and hence it is difficult for the host 20 to recognize a function from the address.

Accordingly, as described above, it is possible for the host 20 to easily recognize the function by using "FID/FNO".

Further, it is possible to control, for example, a plurality of buffers of the host 20 by using "FID/FNO".

Figure 32:
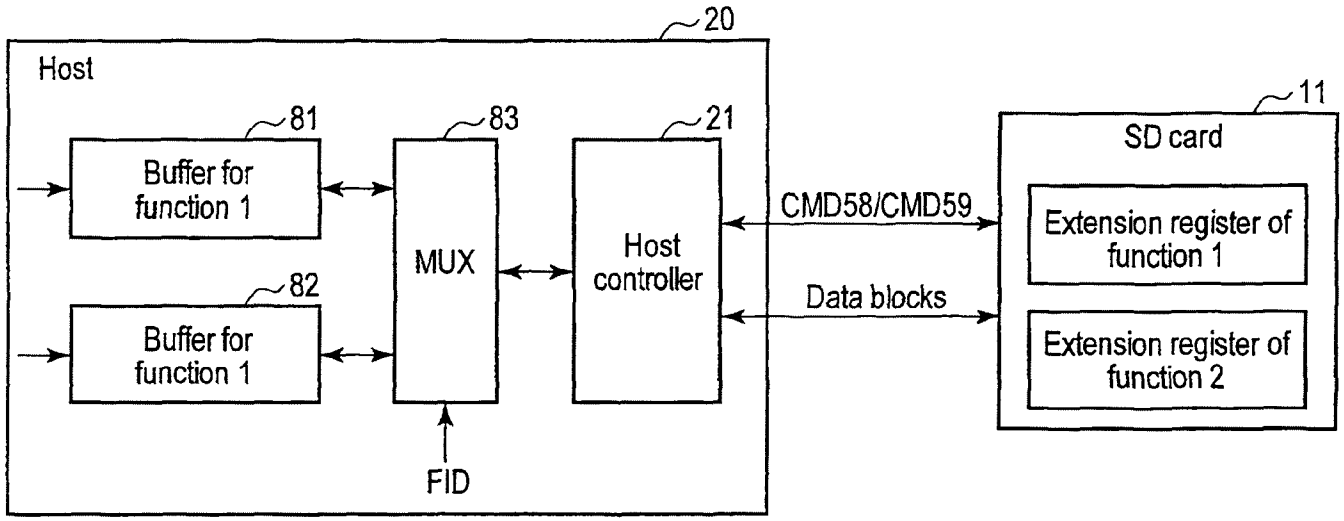
FIG. 32 is a schematic block diagram shown to explain control of a buffer according to the second embodiment.

As shown in FIG. 32, the host 20 includes buffers 81 and 82 to be used when the host 20 carries out data transfer with respect to a plurality of functions of an SD card serving as the memory device 11, the buffers independently corresponding to the functions. These buffers 81 and 82 are connected to the host controller 21 through a multiplexer (MUX) 83. The buffers 81 and 82 and the multiplexer 83 are constituted by virtual components, and the buffers 81 and 82 are configured on the system memory, and a function of the multiplexer 83 is realized by a software by a driver. An address of buffers selected by the multiplexer 83 is supplied to the host controller. By controlling the multiplexer 83 by means of "FID/FNO", it is possible to select a buffer 81 or 82 corresponding to each function.

That is, the host 20 can select a corresponding buffer 81 or 82 in accordance with "FID/FNO" set to the command CMD 58/59 by using the multiplexer 83.

When, for example, a read command CMD 58 has been issued from the host controller 21, data read from an extension register of the corresponding function of the memory device 11 is supplied to the multiplexer 83 through the host controller 21. The multiplexer 83 supplies the received data to one of the buffers 81 and 82 on the basis of "FID/FNO".

Further, when, for example, a write command CMD 59 is issued from the host controller 21, the multiplexer 83 supplies data selected from one of the buffers 81 and 82 to the host controller 21 on the basis of "FID/FNO", and host controller 21 transfers the data to the memory device 11. The memory device 11 supplies the data to an extension register of the corresponding function on the basis of "FID/FNO".

As described above, "FID/FNO" is used to control the multiplexer 83, whereby it is possible to surely select the buffer 82 or 83 corresponding to each function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a nonvolatile semiconductor memory device; and a control section configured to control the nonvolatile semiconductor memory device and an extension register space, the extension register space being capable of defining an interface controlling [an] extended [function] *functions* through an extended function section, wherein the extension register space stores information, the information is configured to specify [a type] *one* of the extended [function] *functions* and a controllable driver, and to include address information indicating a place where [a] *an extension* register for controlling the *one of the* extended [function] *functions* is stored, the control section is arranged to process a first command to read data from the extension register space in accordance with designations of the address information and data length, and a second command to write data to the extension register space in accordance with designations of the address information and data length.

2. The device according to claim 1, wherein each of the first and second commands comprises an address field and a length field in an argument of either of the first and second commands used to access data in one page of the extension register space constituted of a plurality of pages, a value of a mode field in the argument of each of the first and second commands selects a first operation mode, the first operation mode of the first command corresponds to a read operation of reading data including an effective data indicated by the length field from a position of the *extension* register indicated by the address field, and the first operation mode of the second command corresponds to a write operation of writing data including an effective data indicated by the length field to a position of the *extension* register indicated by the address field.

3. The device according to claim 2, wherein in the first operation mode of the first command, data items placed a location in a designated page of the *extension* register, a top of the data items location is designated by the address field, are arranged to transfer the data items from a head of a read data block, the length field indicating an effective data length from head of read data block, and in the first operation mode of the second command, data items transferred from the head of a write data block are written to a page of the *extension* register, the top of write position in a designated page of the *extension* register is specified by the address field and data length to be written is specified by the length filed.

4. The device according to claim 2, wherein the argument of the second command includes a bit used to select whether or not mask write is to be carried out, when mask write is not carried out, the length field indicates an effective write data length, and when mask write is carried out, the length field becomes a fixed value, the length field indicates mask information used to select whether write is to be carried out in units of one bit or original data is to be held, and the mask information and write data length are the same length as the fixed value.

5. The device according to claim 2, further comprising a function which is controlled by multiple methods using an extension register set configured by multiple [of] *extension* registers, multiple of functions are controlled by singly extension register set, wherein function identification information in the extension register space includes common information for all functions and multiple of information to identify a location of each extension register set in the extension register space.

6. The device according to claim 2, further comprising a third command used as a read command supporting fixed-length block transfer and multi-block transfer, and a fourth command used as a write command supporting fixed-length block transfer and multi-block transfer, wherein each of the third and fourth commands includes an address field as an argument thereof, data transfer is executed when the address field designates a data port of the *extension* register, and data length transfer is specified by a block count.

7. The device according to claim 2, further comprising:

a fifth command which enables read/write supporting variable-length block transfer, and multi-block transfer;

a sixth command which enables read/write of 1-byte data by the argument and the response; and a function register set which can be accessed by the fifth and sixth commands, wherein the function register set which can be accessed by the fifth and sixth commands can also be accessed by the first and second commands.

8. The device according to claim 2, wherein each of the first and second commands comprises an address field and a length field in the argument of the first and second commands used to access data in one page of the extension register space constituted of a plurality of pages, a value of the [a] mode field in the argument of each of the first and second commands selects a second operation mode, in the second operation mode of each the first and second commands, a specific address indicated by the address field is interpreted as a data port of the *extension* register, the first command reads data from the extended function section through the data port which is associated with the *one of the* extended [function,] *functions* and the second command writes data to the extended function section through the data port which is associated with the *one of the* extended [function] *functions*.

9. The device according to claim 1, wherein the information which is placed in the extension register space includes any one of [a] function identification codes configured to recognize a standard extended function, manufacturer identification information configured to recognize a manufacturer, and a function identification information for identifying classification for the *standard* extended function, wherein the information is used as an information for selecting a general-purpose driver or a dedicated driver.

10. A host system to use a memory device, the memory device including a nonvolatile semiconductor memory device, the host system is accessible to a memory space and an extension register space of the nonvolatile semiconductor memory device, and the host system can control an extended function section through extension register set which is placed in the extension register space, wherein an information register in the extension register space indicates information which is configured to specify [a type of the] *one* extended function *included to the extended function section* and a controllable driver, and address information indicating a place where [a] *an extension* register for controlling the *one* extended function is stored, the control section is arranged to process a first command to read data from the extension register space in accordance with designations of the address information and data length, and a second command to write data to the extension register space in accordance with designations of the address information and data length, the host system comprising a host driver and a system memory, wherein the host driver uses the first command to read a function identification code, a manufacturer identification information, and a function identification information from the information which is described in the information register in the extension register space, and specify a usable general-purpose function driver or a dedicated function driver and, when a driver exists, the host driver loads the driver into the system memory, and execution of the function driver initializes the *one* extended function in the memory device.

11. The host system according to claim 10, wherein the host driver delivers position information about the *extension* register assigned to the *one of the* extended [function] *functions* to the loaded function driver from the information, thereby making the *one of the* extended [function] *functions* controllable even when the *extension* register is arranged at an arbitrary position.

12. The host system according to claim 10, wherein each of the first and second commands comprises an address field and a length field in an argument of either of the first and second commands used to access data in any one page of the extension register space constituted of a plurality of pages, a first operation mode of the first command corresponds to a read operation of reading data including an effective data indicated by the length field from a position of the *extension* register indicated by the address field, and the first operation mode of the second command corresponds to a write operation of writing data including an effective data indicated by the length field to a position of the *extension* register indicated by the address field.

13. The host system according to claim 12, further comprising a third command used as a read command supporting multi-block transfer, and a fourth command used as a write command supporting multi-block transfer, wherein each of the third and fourth commands includes an address field as an argument thereof, multi-block data transfer is executed when the address field designates a data port of at least one byte register in a second operation mode, in the second operation mode of each the first, second, third and fourth commands, a specific address indicated by the address field is interpreted as a data port of the *extension* register.

14. The host system according to claim 13, wherein the host driver accesses the *extension* register of the memory device by the first and second commands or by the third and fourth commands in the first operation mode, and carries out data transfer between the host system and the extended function section of the memory device in the second operation mode.

15. The host system according to claim 10, wherein the host driver recognizes [a certain] *the one extended* function from a plurality of multi-function devices by the information including function identification code, manufacturer identification information, and a function identification information which are singly assigned to each function, and location of the *extension* register is determined by address field of the information which is corresponded with the [specified] *one extended* function, and length of the *extension* register is specified in the *extension* register of the *one extended* function.

*16. A method for processing data by a processor which controls a nonvolatile memory device and an extension register space capable of defining an interface controlling an extended function through an extended function circuit, the method comprising*

*receiving a first command;*

*reading data from the extension register space in accordance with designations of address information and data length;*

*receiving a second command; and*

*writing data to the extension register space in accordance with designations of the address information and data length,*

*wherein the address information is included in information stored in the extension register space.*

*17. The method according to claim 16, wherein the information is configured to specify an extended function and a controllable driver.*

*18. The method according to claim 16, wherein*

*each of the first and second commands comprises an address field and a length field in an argument of either of the first and second commands used to access data in one page of the extension register space constituted of a plurality of pages,*

*a value of a mode field in the argument of each of the first and second commands selects a first operation mode,*

*the first operation mode of the first command corresponds to a read operation of reading data including an effective data indicated by the length field from a position of an extension register indicated by the address field, and*

*the first operation mode of the second command corresponds to a write operation of writing data including an effective data indicated by the length field to a position of the extension register indicated by the address field.*

*19. The method according to claim 18, wherein in the first operation mode of the first command, data items placed a location in a designated page of the extension register are arranged to transfer the data items from a head of a read data block, a top of the data items location is designated by the address field, and the length field indicated an effective data length from head of read data block, and*

*in the first operation mode of the second command, data items transferred from the head of a write data block are written to a page of the extension register, and the top of write position in a designated page of the extension register is specified by the address field and data length to be written is specified by the length filed.*

*20. The method according to claim 18, wherein the argument of the second command includes a bit used to select whether or not mask write is to be carried out,*

*when the mask write is not carried out, the length field indicates an effective write data length, and*

*when the mask write is carried out, the length field becomes a fixed value, the length field indicates mask*

*information used to select whether write is to be carried out in units of one bit or original data is to be held, and the mask information and write data length are the same length as the fixed value.*

*21. The method according to claim 18, wherein a function is prepared, which is controlled by multiple methods using an extension register set configured by multiple extension registers, multiple of functions are controlled by singly extension register set,*

*wherein function identification information in the extension register space includes common information for all functions and multiple of information to identify a location of each extension register set in the extension register space.*

*22. The method according to claim 18, wherein a third command is further used as a read command supporting fixed-length block transfer and multi-block transfer, and a fourth command is further used as a write command supporting fixed-length block transfer and multi-block transfer, wherein*

*each of the third and fourth commands includes an address field as an argument thereof, data transfer is executed when the address field designates a data port of the extension register, and data length transfer is specified by a block count.*

*23. The method according to claim 18, wherein*

*a fifth command is used to enable read/write supporting variable-length block transfer, and multi-block transfer;*

*a sixth command is used to enable read/write of 1-byte data by the argument and the response; and*

*the first, second, fifth, and sixth commands are capable of accessing to a function register set.*

*24. The method according to claim 18, wherein*

*each of the first and second commands comprises an address field and a length field in the argument of the first and second commands used to access data in one page of the extension register space constituted of a plurality of pages,*

*a value of the mode field in the argument of each of the first and second commands selects a second operation mode,*

*in the second operation mode of each the first and second commands, a specific address indicated by the address field is interpreted as a data port of the extension register,*

*the first command reads data from the extended function section through the data port which is associated with the extended function, and*

*the second command writes data to the extended function section through the data port which is associated with the extended function.*

*25. The method according to claim 16, wherein the information which is placed in the extension register space includes any one of function identification codes configured to recognize a standard extended function, manufacturer identification information configured to recognize a manufacturer, and a function identification information for identifying classification for the standard extended function, wherein the information is used as an information for selecting a general-purpose driver or a dedicated driver.*

* * * * *